United States Patent [19]
Shioiri et al.

[11] Patent Number: 5,631,110
[45] Date of Patent: May 20, 1997

[54] PROCESS OF FABRICATING PHOTO-MASK USED FOR MODIFIED ILLUMINATION, PROJECTION ALIGNER USING THE PHOTO-MASK AND METHOD OF TRANSFERRING PATTERN IMAGE FROM THE PHOTO-MASK TO PHOTO-SENSITIVE LAYER

[75] Inventors: Satomi Shioiri; Hiroyoshi Tanabe, both of Tokyo, Japan

[73] Assignee: NEC Corporation, Tokyo, Japan

[21] Appl. No.: 498,335

[22] Filed: Jul. 5, 1995

[30] Foreign Application Priority Data

| Jul. 5, 1994 | [JP] | Japan | 6-153185 |
| Jul. 5, 1994 | [JP] | Japan | 5-153189 |
| Nov. 21, 1994 | [JP] | Japan | 6-286265 |

[51] Int. Cl.$^6$ .................. G03F 9/00
[52] U.S. Cl. ............. 430/5; 430/22; 430/394
[58] Field of Search ............. 430/5, 22, 311, 430/394; 356/400, 401

[56] References Cited

U.S. PATENT DOCUMENTS 4,895,780  1/1990  Nissan-Cohen et al. ............ 430/5

FOREIGN PATENT DOCUMENTS

| 62-50811 | 10/1987 | Japan . |
| 63-165851 | 7/1988 | Japan . |
| 63-216052 | 9/1988 | Japan . |
| 4-179952 | 6/1992 | Japan . |
| 4-180612 | 6/1992 | Japan . |

OTHER PUBLICATIONS

Alexander Starikov, "Use of a single size square ... method, design, and practice.", *SPIE vol. 1088 Optical/Laser Microlithography II*, (Mar. 1989), pp. 34–47.

Oberdan W. Otto et al., "Automated optical proximity correction —a rules–based approach", *SPIE vol. 2197 Optical/Laser Microlithography VII*, (Mar. 1994), pp. 278–293.

John P. Stirniman et al., "Fast proximity correction with zone sampling", *SPIE Optical/Laser Microlithography VII*, (Mar. 1994), pp. 294–301.

Abstract of JP 040179952 (NEC).

Abstract of JP 630216052 (Fujitsu).

Abstract of JP 630165851 (Sony).

*Primary Examiner*—S. Rosasco
*Attorney, Agent, or Firm*—Sughrue, Mion, Zinn, Macpeak & Seas

[57] ABSTRACT

In order to produce a photo-mask for a modified illumination, corrective patterns are added to and/or deleted from each target area of a design pattern so as to minimize a deformation of an optical image on a photo-resist layer, and the corective patterns are calcualted by using algebraic equations without a trial-and-error.

11 Claims, 26 Drawing Sheets

PROCESS OF FABRICATING PHOTO-MASK USED FOR MODIFIED ILLUMINATION, PROJECTION ALIGNER USING THE PHOTO-MASK AND METHOD OF TRANSFERRING PATTERN IMAGE FROM THE PHOTO-MASK TO PHOTO-SENSITIVE LAYER

FIELD OF THE INVENTION

This invention relates to a lithographic technology available for a semiconductor fabrication and, more particularly, to a process of fabricating a photo-mask used for a modified illumination, a projection aligner using the photo-mask and a method of transferring a pattern image from the photo-mask to a photo-sensitive layer.

DESCRIPTION OF THE RELATED ART

A semiconductor integrated circuit device is fabricated on a semiconductor substrate, and conductive patterns and insulating layers are alternately laminated on the semiconductor substrate. The conductive patterns are usually formed through the lithographic technology. A projection aligner illuminates a photo-mask, and the photo-mask feature is transferred onto the photo-resist layer. When the photo-resist layer is developed, a conductive pattern is realized on the semiconductor substrate.

The resolution of the transferred image and the depth of focus depend the numerical aperture of the projection optical system incorporated in the projection aligner and the wavelength of the exposure light. If the numerical aperture is enlarged or the wavelength is shortened, the resolution is enhanced. However, the depth of focus becomes shallow. Thus, there is a trade-off between the resolution and the depth of focus.

A modified illumination improves both of the resolution and the depth of focus. For example, a modified illuminator is disclosed by Delmer L. Fehrs et al. in "Illuminator Modification of An Optical Aligner", Proceedings of KTI Microelectronics Seminar, Nov. 6-7, 1989, pages 217 to 230. Delmer L. Fehrs et al. teaches a bundle of optical fibers provided in the optical path, and the bundle of optical fibers converts the radiated light beam to an annular illumination.

Japanese Patent Publication of Unexamined Application No. 4-180612 discloses another modified illumination called a split illumination. According to the Japanese Patent Publication of Unexamined Application, a luminous flux converting member is provided in an optical path of an illumination optical system, and splits the luminous flux into two luminous fluxes.

Both the annular illumination and the split illumination make a central area of the luminous flux dark, and achieve a high resolution and a large depth of focus. Thus, the projection aligner has been improved in the resolution and the depth of focus.

Although a high-resolution large focus depth projection aligner is available, the conductive/insulating pattern is progressively miniaturized, and the transferred pattern tends to be deviated from the design pattern. When using the modified illumination or a phase-shift technology disclosed in Japanese Patent Publication of Examined Application No. 62-50811, this tendency is serious.

The tendency is derived from spatial frequency response characteristics which differ between a conventional illumination and the modified illumination. FIG. 1 shows the spatial frequency response characteristics A under the conventional illumination and the spatial frequency response characteristics B under the modified illumination. Both spatial frequency response characteristics A and B are represented by the contrast of a line and a space adjusted to 1:1 in terms of the spatial frequency or the inverse of the pattern pitch of the line-and-space pattern.

The measurement was carried out by using a KrF excimer stepper radiating light with the wavelength (lambda) of 0.248 micron, and the numerical aperture (NA) was 0.5. The coherent factor (sigma) in the conventional illumination was 0.7. A shading plate 1 shown in FIG. 2 was used in the modified illumination, and an annular aperture 1a was formed in the shading plate 1. The radius of an inner circular area 1b was 70 percent of sigma.

Comparing the spatial frequency response characteristics A under the conventional illumination with the spatial frequency response characteristics B under the modified illumination, it is understood that high frequency components of the spatial frequency response are enlarged in the modified illumination, and this phenomenon is eminent in a range where the spatial frequency is larger than NA/lambda. As a result, the resolution is enhanced, but the optical image through the modified illumination is different from the optical image through the conventional illumination.

FIG. 3 shows a pattern 2 to be transferred, and shading portions 2a and transparent portion 2b form the pattern 2. The shading portions 2a are hatched so as to be easily discriminated from the transparent portion 2b. The shading portions 2a are two dimensionally repeated, and form an array as shown.

The pattern 2 was installed in the excimer stepper, and was transferred to photo-resist layers at ⅕. When the pattern 2 was illuminated by the conventional illumination, the transferred shading portions 2c were slightly widened as shown in FIG. 4. However, the transferred shading portions 2d transferred through the modified illumination were deformed, and became wider than the transferred shading portions 2c as shown in FIG. 5. Especially, the width was increased from 0.35 micron to 0.42 micron, and was widened at 20 percent.

The tolerance of the line width in a standard design work is ±10 percent, and the increase at 20 percent exceeds the tolerance. The transferred shading portions 2d are arranged in a matrix at intervals of 0.25 micron, and the interval is the minimum dimension. The minimum dimension of 0.25 micron has a frequency spectrum with a center at 1/0.25 micron=4 micron $^{-1}$, and the central frequency component of 4 micron $^{-1}$ is greater than NA/lambda=2.02 micron$^{-1}$. For this reason, the modified illumination widely deforms the transferred pattern.

Thus, the modified illumination deforms the transferred pattern, and it has been proposed to previously change the dimensions of a pattern to be transferred. If a pattern of a photo-mask is previously changed, the deformation due to the modified illumination is canceled, and the geometry of the transferred pattern becomes closer to those of the design pattern. This technology is called as "optical proximity correction".

For example, Japanese Patent Publication of Unexamined Application No. 4-179952 discloses a method of forming a miniature pattern, and a line-and-space pattern is one-dimensionally corrected on a photo-mask. The one-dimensional line-and-space correction is carried out through an optimization of an optical intensity distribution, and the optimization requires repetition of calculating the optical intensity distribution by changing the line width.

Another example is disclosed in Japanese Patent Publication of Unexamined Application No. 63-216052. FIG. 6 illustrates a photo-mask 3, and the photo-mask 3 has a rectangular pattern 3a to be transferred. Corrective patterns 3b are added to the four corners of the rectangular pattern 3a. As shown in FIGS. 5, the corners of a rectangular pattern become round, and the corrective patterns 3b correct the round corners to be the right angle on a photo-sensitive layer.

Using these optical proximity correction technologies, the prior art projection aligner is expected to transfer a miniature pattern image to a photo-sensitive layer through the modified illumination.

However, the prior art optical proximity correction technology disclosed in Japanese Patent Publication of Unexamined Application No. 4-179952 only one-dimensionally corrects the line-and-space pattern, and the repetition of the calculation consumes a large amount of time and labor. This Japanese Patent Publication of Unexamined Application is silent as to a correction of two-dimensional pattern.

On the other hand, the prior art correction disclosed in Japanese Patent Publication of Unexamined Application No. 63-216052 teaches the corrective patterns 3b for the corner only. This Japanese Patent Publication of Unexamined Application is silent as to the correction of other geometries, and does not teach how to design the corrective pattern 3b. Although the design method disclosed in Japanese Patent Publication of Unexamined Application No. 4-179952, i.e., the optimization through repetition of the calculation is applied to the design of the corrective pattern 3b, the design work of the corrective pattern 3b similarly consumes a large amount of time and labor, and the disclosed method is not available for a transfer of an ultra miniature pattern with good fidelity.

Japanese Patent Publication of Unexamined Application Nos. 63-165851 and 63-216052 disclose other correction technologies. However, these technologies hardly improve the resolution and the depth of focus.

Thus, the prior art optical proximity correction technologies are less effective against deterioration of the fidelity in a transfer of an ultra miniature pattern through the modified illumination.

SUMMARY OF THE INVENTION

It is therefore an important object of the present invention to provide a process of fabricating a photo-mask which is simple and available for a pattern transfer on an ultra miniature pattern.

It is also an important object of the present invention to provide a projection aligner which transfers an ultra miniature pattern image from the photo-mask to a photo-sensitive layer without a serious deformation.

It is also an important object of the present invention to provide a method of transferring the ultra miniature pattern image from the photo-mask to the photo-sensitive layer.

In accordance with one aspect of the present invention, there is provided a process of fabricating a photo-mask available for a pattern transfer from a photo-mask to a photo-sensitive layer, comprising the steps of: determining a design pattern having a target area, a first peripheral line of the target area being divided into a plurality of first sections respectively having target points; determining a first image pattern having a deformed area image transferred from the target area to the photo-sensitive layer through the modified illumination and a second image pattern having a non-deformed area image obtained by transferring the target area onto the photo-sensitive layer without a deformation at a magnification ratio equal to a magnification ratio of the deformed area image, the deformed area image and the non-deformed area image respectively having a second peripheral line and a third peripheral line respectively divided into a plurality of second sections respectively corresponding to the plurality of first sections and a plurality of third sections respectively corresponding to the plurality of second sections, the plurality of second sections respectively having first reference points corresponding to the target points, the plurality of third sections respectively having second reference points corresponding to the first reference points; determining a modified area having a fourth peripheral line divided into a plurality of fourth sections respectively corresponding to the plurality of first sections, the plurality of fourth sections having respective corrected points corresponding to the target points, distances between the target points and the corrected points being calculated through algebraic equations in such a manner that the plurality of fourth sections minimize differences in optical intensity between the first reference points and the corresponding second reference points; replacing the target area with the modified area; and forming a photo-mask having a modified pattern with the modified area.

In accordance with another aspect of the present invention, there is provided a projection aligner for transferring a modified pattern produced from a design pattern and formed on a photo-mask to a photo-sensitive layer, comprising: an illumination system including a light source for radiating an luminous flux and an luminous flux converting means for converting the luminous flux to a modified luminous flux, the modified luminous flux having a central area darker than a central area of the luminous flux; a projection optical system for projecting the modified luminous flux to the photo-sensitive layer; and a mask holding system holding the photo-mask between the luminous system and the projection optical system so that the modified luminous flux carries the modified pattern onto the photo-sensitive layer, the design pattern being corrected to the modified pattern in such a manner as to minimize a difference in optical intensity between an optical image on the photo-sensitive layer and a quasi optical image geometrically similar to the design pattern on the photo-sensitive layer by using algebraic equations.

In accordance with yet another aspect of the present invention, there is provided a method of transferring a modified pattern to a photo-sensitive layer, comprising the steps of: preparing a projection aligner including a modified illumination system with a light source for radiating an luminous flux, a projection optical system and a stage, a photo-sensitive layer and a photo-mask having a modified pattern, the luminous flux having a central area darker than a peripheral area of the luminous flux, a design pattern being corrected to the modified pattern in such a manner as to minimize a difference in optical intensity between an optical image on the photo-sensitive layer and a quasi optical image geometrically similar to the design pattern on the photo-sensitive layer by using algebraic equations; placing the photo-mask and the photo-sensitive layer between the modified illumination system and the projection optical system and after the projection optical system, respectively; and radiating the luminous flux from the modified illumination system through the photo-mask and the projection optical system to the photo-sensitive layer so as to form the optical image of the modified pattern on the photo-sensitive layer.

BRIEF DESCRIPTION OF THE DRAWINGS

The features and advantages of the process of fabricating a photo-mask, the projection aligner and the method of transferring a pattern image from the photo-mask to a photo-sensitive layer according to the present invention will be more clearly understood from the following description taken in conjunction with the accompanying drawings in which.

DESCRIPTION OF THE PREFERRED EMBODIMENTS

Photo-Mask Used in Projection Aligner

First Embodiment

Figure 7:
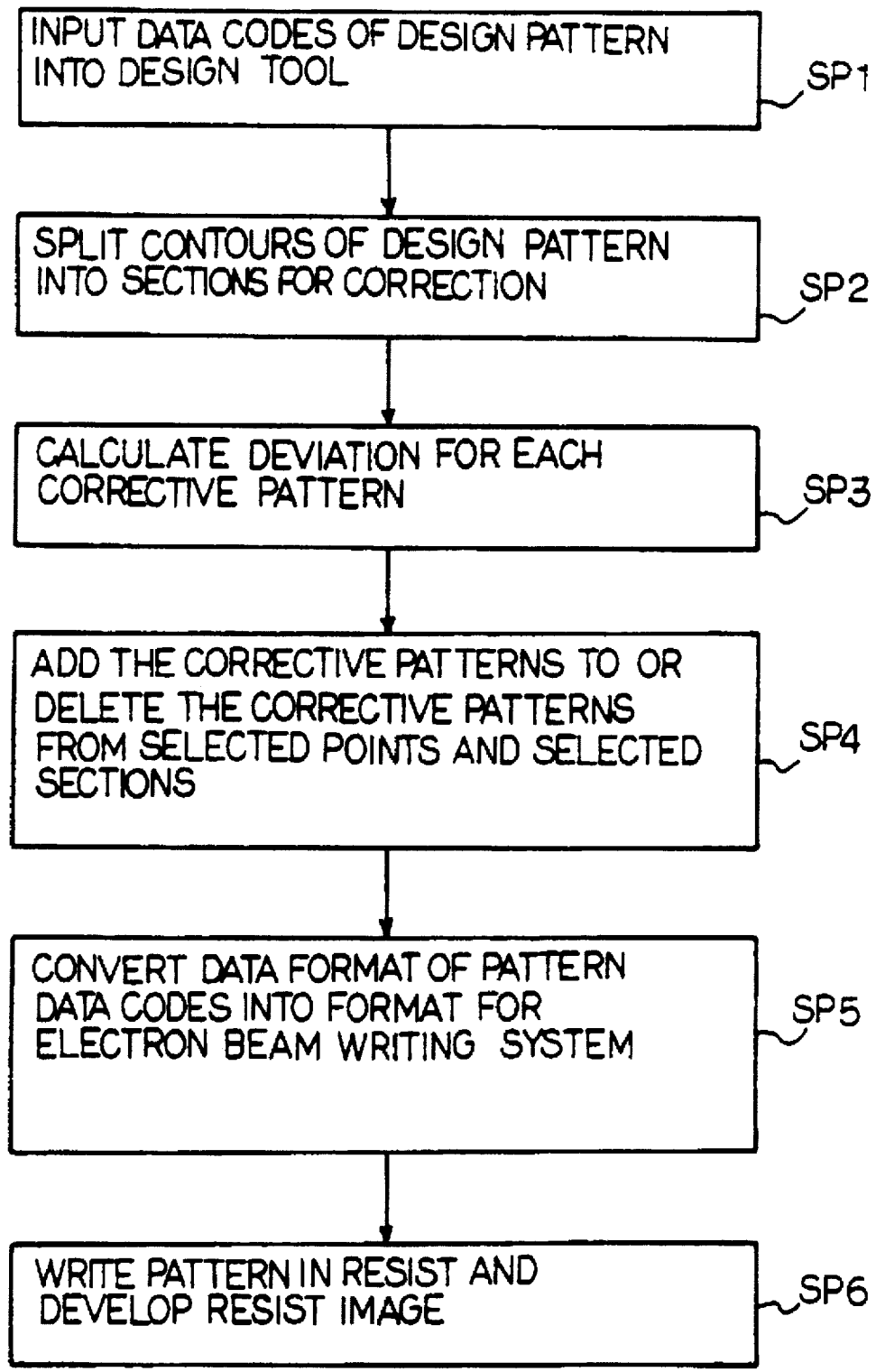
FIG. 7 is a flow chart showing a process of fabricating a photo-mask according to the present invention.

First, the outline of a fabrication process embodying the present invention is described with reference to FIG. 7. The process of fabricating a photo-mask starts with preparation of a design pattern to be exposed to a light beam in a projection aligner. Pattern data codes representative of the design pattern are input to a design tool (not shown) as by step SP1.

The design tool splits the contours of the design pattern into a plurality of sections, and determines correction points on the respective sections as by step SP2.

Subsequently, the design tool calculates a deviation of a corrective pattern from the design pattern or the amount of correction to be added to or deleted from each of the sections at the correction point as by step SP3. In this instance, the deviation of the corrective pattern is hereinbelow referred to as "width w".

The corrective patterns thus determined are added to or deleted from the selected correction points of the sections, and, accordingly, the design tool determines a corrected design pattern as by step SP4.

Subsequently, the pattern data codes representative of the corrected design pattern are converted into data codes for an electron beam writing system (not shown) as by step SP5.

The converted data codes representative of the corrected design pattern are supplied to the electron beam writing system, and the electron beam writing system writes a pattern corresponding to the corrected design pattern in a resist layer on a mask blank (not shown). The resist image in the resist layer is developed in an etchant, and a photo-mask is obtained as by step SP6.

Although the electron beam writing system is used in this instance, a laser beam writing system is similarly available for the fabrication of the photo-mask.

Figure 8:
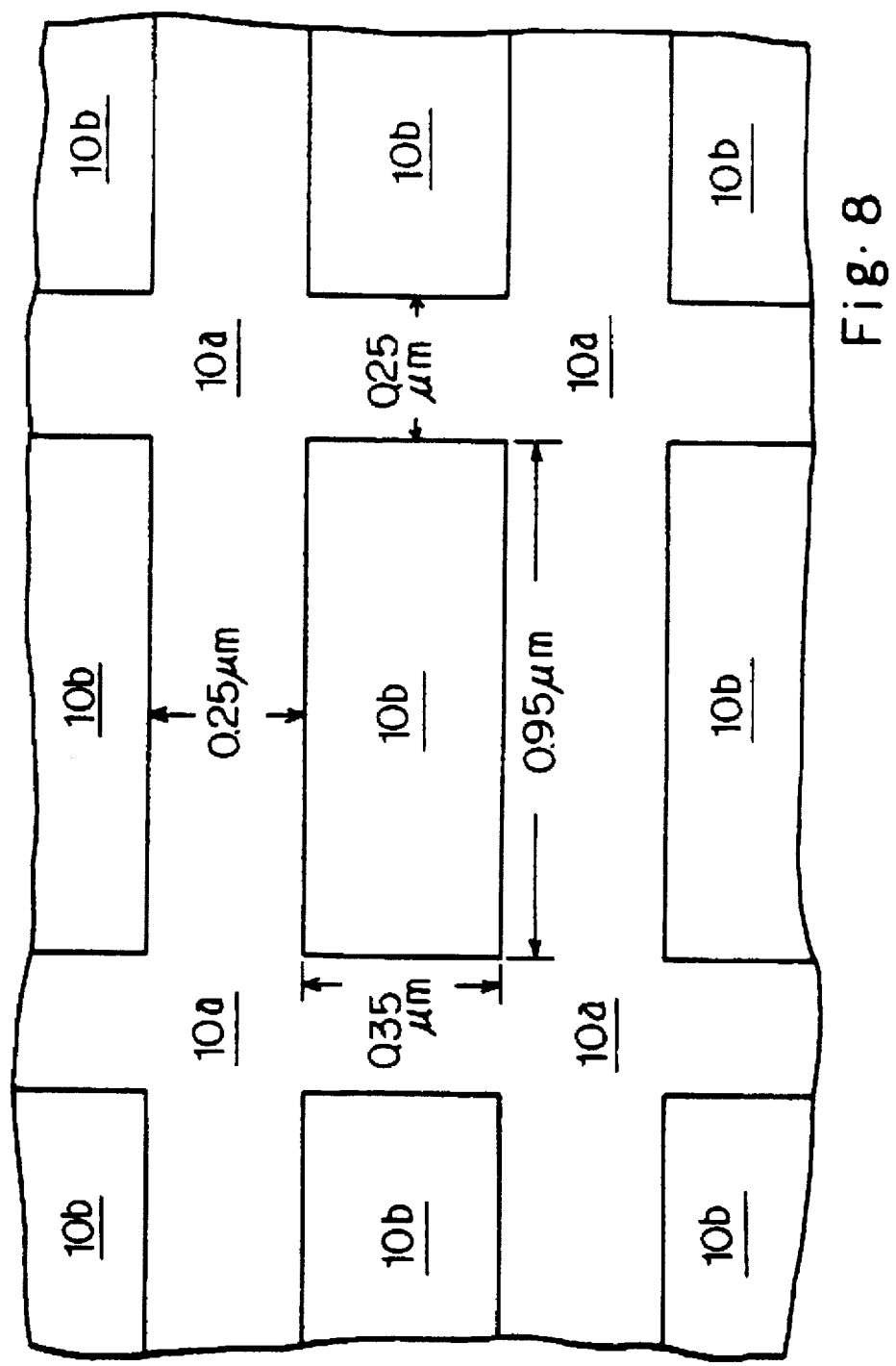
FIG. 8 is a plan view showing a design pattern treated with an optical proximity correction.

The above described process sequence is detailed as follows. FIG. 8 illustrates an example of the design pattern. A transparent area is designated by reference 10a, and is shaped in a lattice. The width of the transparent area is 0.25 micron. Rectangular shading portions 10b are arranged in matrix as shown, and the shading portions 10b are 0.95 micron in length and 0.35 micron in width.

Figure 9:
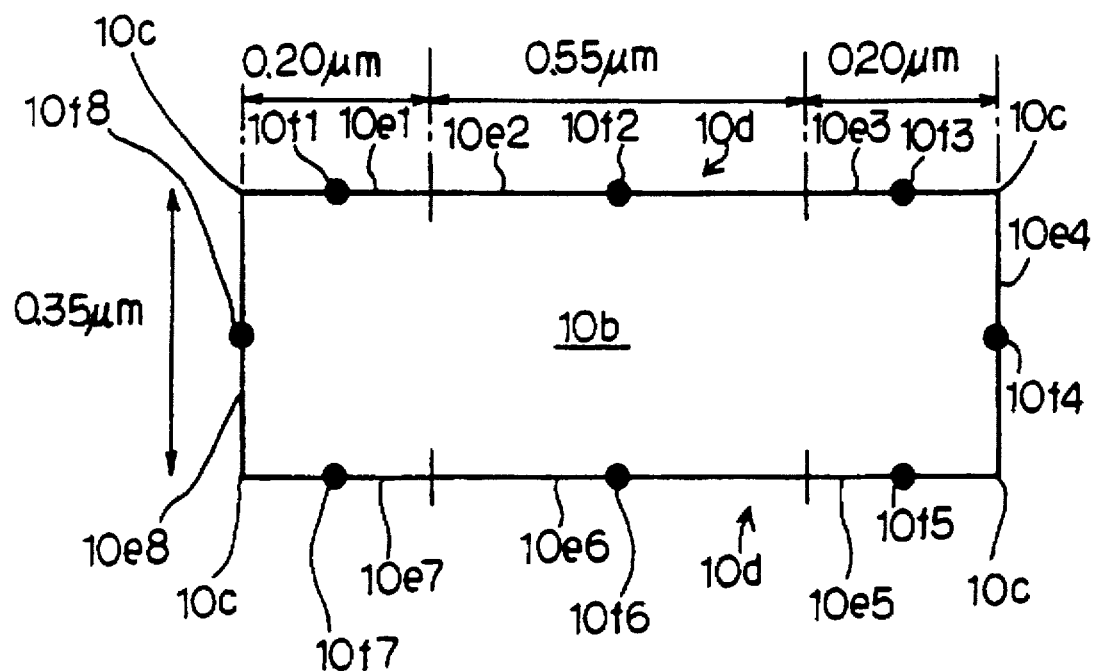
FIG. 9 is a plan view showing a shading portion of the design pattern to be split in accordance with the present invention.

The design tool splits the outer peripheral line of the shading portion 10b as shown in FIG. 9. That is, a predetermined length is measured from the four corners 10c of the rectangular shading portion 10b, and each of the long edges 10d are split into three sections. The predetermined length is determined on the basis of the accuracy of the photo-mask writing/etching stage. In this instance, the accuracy of the photo-mask writing/etching stage is assumed to be 1.0 micron, and the magnification on the photo-mask is assumed to be 5. For this reason, the predetermined length is 0.2 micron in this instance. If a writing/etching system is higher in accuracy than the writing/etching system used for the present embodiment, the predetermined length is less than 0.2 micron.

Thus, the peripheral line of the rectangular shading portion 10b is split into sections 10e1 to 10e8, and mid points of the sections 10e1 to 10e8 serve as the correction points 10f1 to 10f8. The sections 10e1 to 10e3 and 10e5 to 10e7 and the sections 10e4 and 10e8 are assumed to be in parallel with the x-axis and to the to y-axis, respectively.

Subsequently, the width w of the corrective pattern or the amount of correction is calculated at each of the correction points 10f1 to 10f8. The amount of correction is determined on the basis of an optical intensity distribution. The amount of correction at the mid point 10f2 (u,v) is, by way of example, determined from the optical intensity distribution I (u,v), and value u and value v are indicative of x-coordinate and y-coordinate of the mid point 10f2. The optical intensity distribution I (u,v) is given as $$I(u,v) = |\int\int drds S(r,s)|\int\int dpdq\hat{t}(p,q)P(p+r,q+s)e^{2\pi i(pu+qv)}|^2 \quad \text{Equation 1}$$

$$\hat{t}(p,q) = \int\int e^{-2\pi i(px+qy)} t(x,y) dxdy \quad \text{Equation 2}$$

where P(p,q) is the pupil function, S(r,s) is an effective light source and t(x,y) is a amplitude transmittance. Although the pupil function P(r,s) contains an aberration such as a defocus, here, the pupil function assumes the aberration to be zero.

Figure 10:
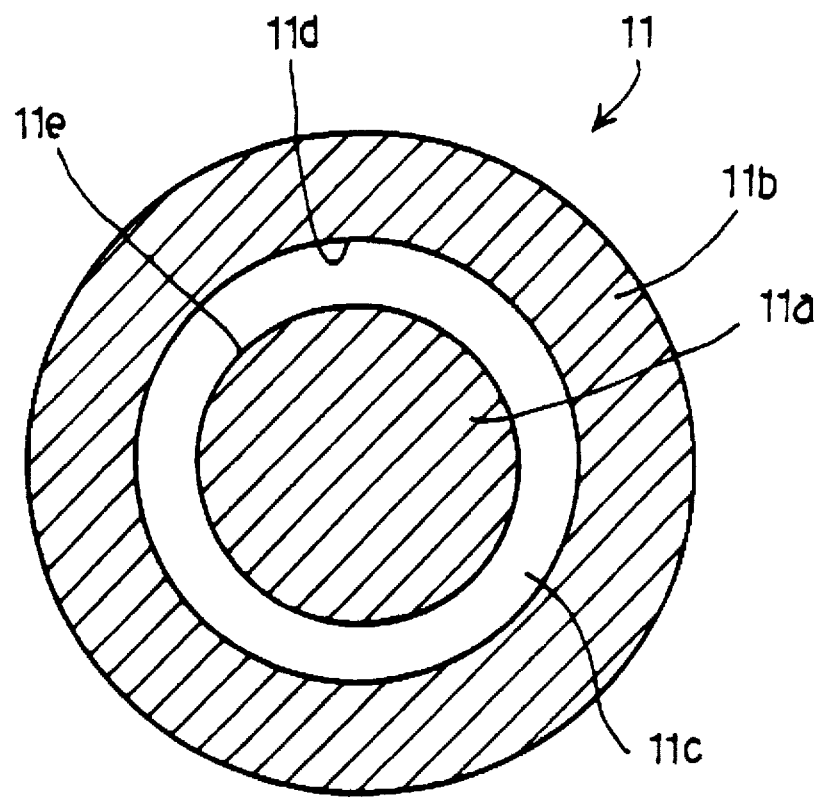
FIG. 10 is a plan view showing a shading plate member used in an analysis.
Figure 11:
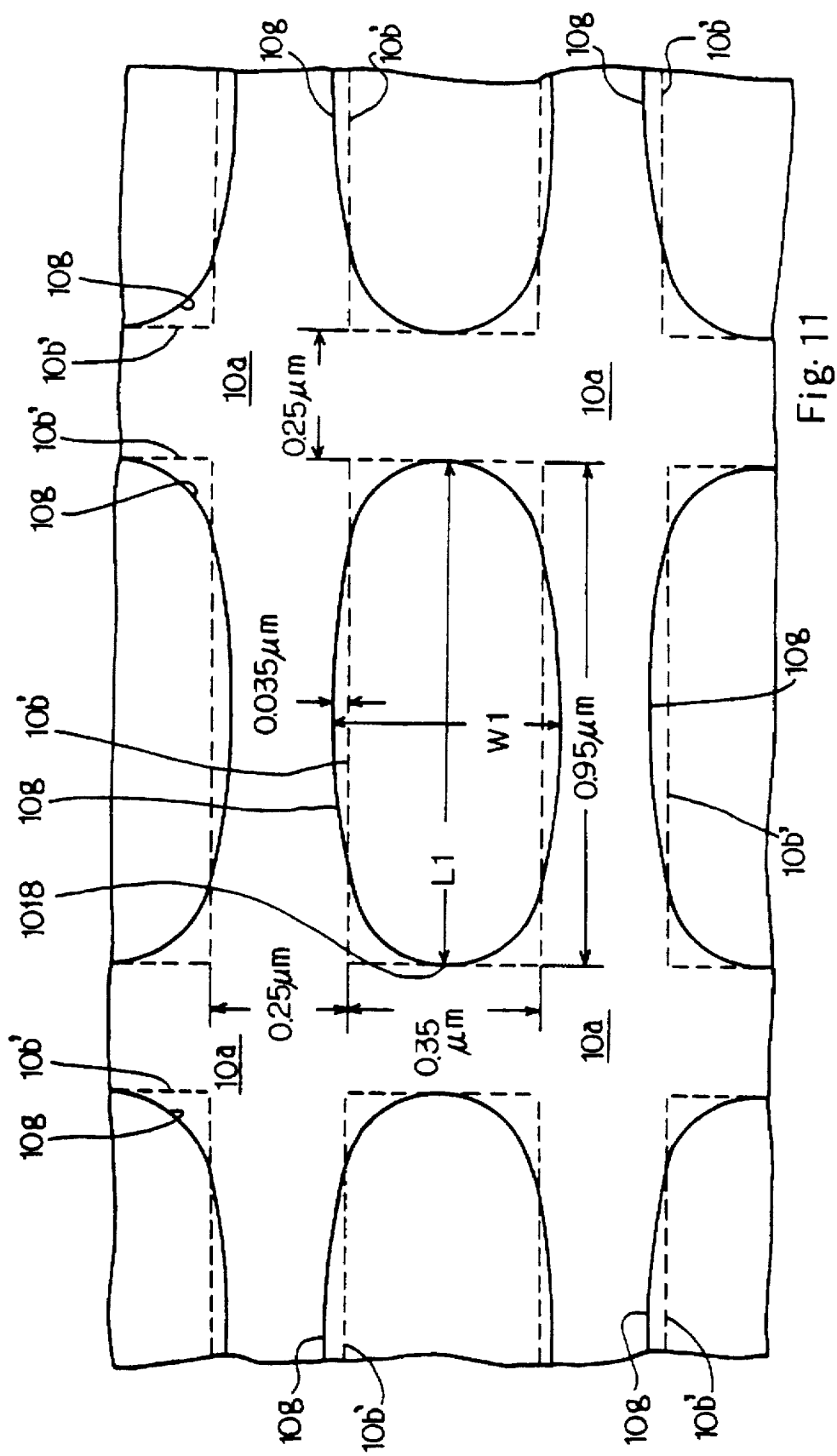
FIG. 11 is a plan view showing an optical image obtained from a non-modified design pattern.

If a stepper equipped with a KrF excimer laser source simply transfers the photo-mask pattern, which is five times larger than the design pattern, to a photo-plate through a modified illumination using a shading plate member 11 shown in FIG. 10 at demagnification ratio of 1/5, the optical image on the photo-plate has deformed shading portions 10g as shown in FIG. 11. L1 and W1 are indicative of the length in the longitudinal direction of the rectangular shading portion 10g and the width in the lateral direction of the rectangular shading portion 10g, respectively. Broken lines 10b' are indicative of images of the non-deformed shading portions equal in magnification ratio to the deformed shading portions 10g.

The shading plate member 11 has an inner shading area 11a and an outer shading area 11b, and an annular aperture 11c is formed between the inner shading area 11a and the outer shading area 11b. The inner shading area 11a and the outer shading area 11b are hatched so as to clearly discriminate the annular aperture 11c. The radius of the outer circle 11d is equivalent to the coherence factor of 0.7, and the radius of the inner circle 11e is 70 percent of the radius of the outer circle 11d. The numerical aperture of the projection optical system is 0.5.

The peripheral line of the deformed shading portion 10g is a contour line indicative of a certain optical intensity. The correction point 10f8 is assumed to have a reference optical intensity Iopt, and the optical intensity at the correction point 10f2 is corrected as follows. Although the optical intensity at the correction point 10f8 is used as the reference optical intensity, an optical intensity at an arbitrary point is available for the correction. In the following description, x-axis is assumed to extend in parallel to the side line 10d, and y-axis is assumed to be perpendicular to the side line 10d.

In order to match the optical intensity at the correction point 10f2 with Iopt, a corrective pattern is added to or deleted from the correction point 10f2. The corrective pattern delta-t (x,y; u,v) is the length of segment 10e2 (0.55 micron) in length and w in width. If the width w has a negative value, the corrective pattern is added. On the other hand, if the width w has a positive value, the correction pattern is deleted. The magnitude of the width w means the amount of correction, and is much smaller than the value of the length.

The correction point 10f2 is on the side line in parallel to x-axis, and the correction pattern delta-t is approximated as Equation 3.

$$\text{delta-t } (x,y; u,v) \approx w \; f(x-u)\delta(y-v) \quad \text{Equation 3}$$

where δ is Dirac's delta function. If x is greater than (−½) and less than (½), f(x) is 1. However, if x is out of the above range, f(x) is zero.

In order to adjust the optical intensity to Iopt when the corrective pattern is added to or deleted from the design pattern, it is necessary to satisfy Equation 4.

$$Iopt = |\int\int drds S(r,s)|\int\int dpdq[\hat{t}(p,q)+\text{delta-}\hat{t}(p,q;u,v)]P(p+r,q+s)e^{2\pi i(pu+qv)}|^2 \quad \text{Equation 4}$$

When substituting the Fourier transformation of Equation 3 for delta-t in Equation 4, Equation 4 is modified to be a quadratic equation, and the amount of correction w is given by using the quadratic formula as follows.

$$w = (-b + \sqrt{b^2 - 4ac})/2a \quad \text{Equation 5}$$

where a, b and c are second-order coefficient, first-order coefficient and zero-order coefficient, respectively. The second-order coefficient, the first-order coefficient and zero-order coefficient are given by Equations 6, 7 and 8.

$$a = \int\int drds S(r,s)|\int\int dpdq \; \text{delta-}\hat{t}0(p,q;u,v)P(p+r,q+s)e^{2\pi i(pu+qv)}|^2 \quad \text{Equation 6}$$

$$b = 2R\{\int\int drds S(r,s)\int\int\int\int dpdqdp'dq'\hat{t}(p,q)\text{delta-}\hat{t}0^*(p',q';u,v) P(p+r,q+s)P^*(p'+r,q'+s)e^{2\pi i[(p-p')u+(q-q')v]}\} \quad \text{Equation 7}$$

$$c = \int\int drds S(r,s)|\int\int dpdq\hat{t}(p,q)P(p+r,q+s)e^{2\pi i(pu+qv)}|^2 - Iopt \quad \text{Equation 8}$$

where $$\text{delta-}\hat{t}0(p,q;u,v) \text{ is } \int\int f(x-u) \; \delta \; (y-v)e^{-i(pu+qv)}dxdy. \quad \text{Equation 9}$$

Substituting actual coordinate (u,v) of each corrective point for u and v of Equations 6 to 9, the values of the coefficients a, b and c are determined. Thereafter, the amount of correction w is given by using Equation 5. R means "real part", and (*) is the complex conjugate. The amount of correction w at the corrective point 10f2 is 0.1 micron. The amount of correction w at another corrective point is similarly calculated by using Equations 5 to 9.

Figure 12:
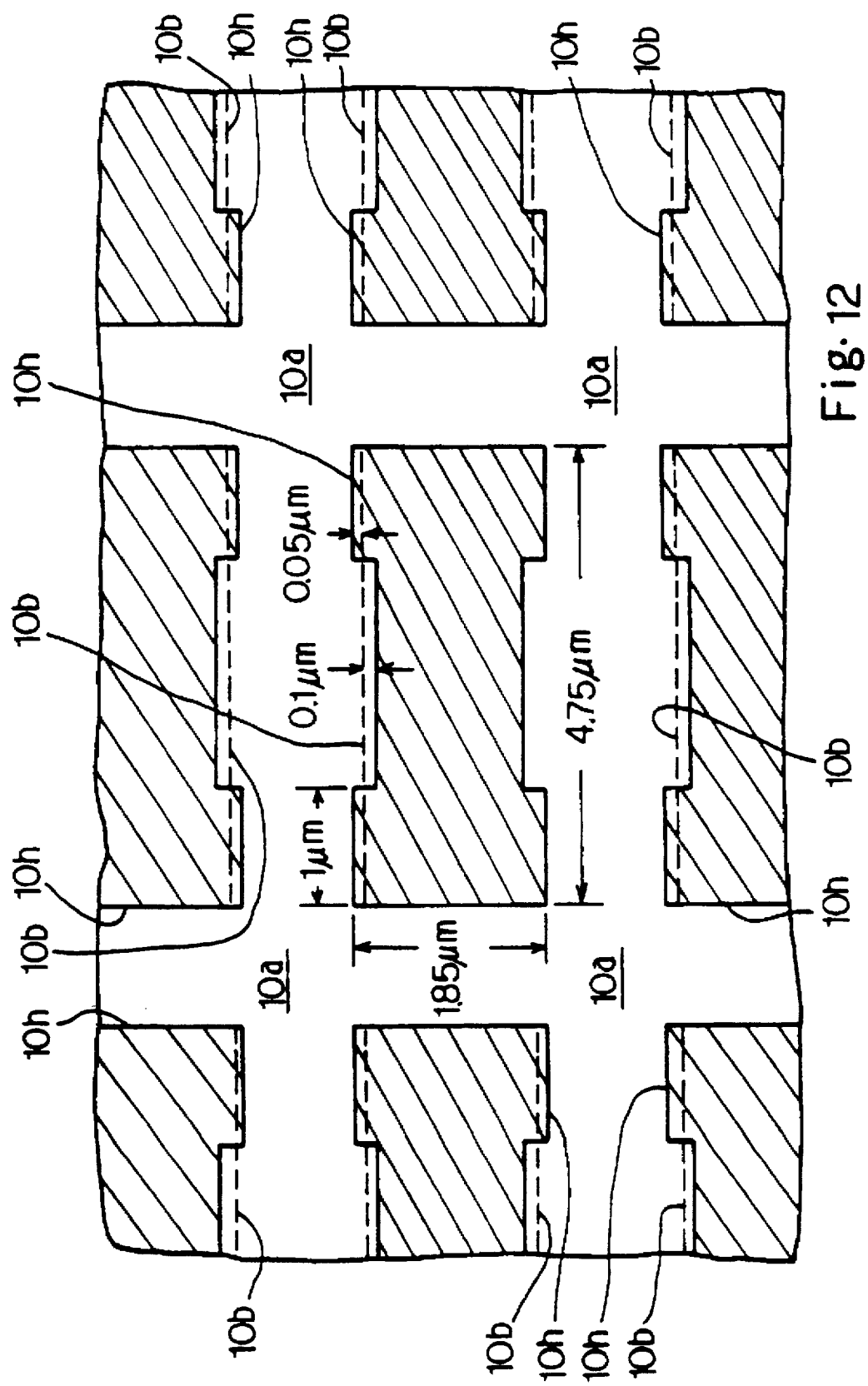
FIG. 12 is a plan view showing a modified photo-mask pattern.

When the amounts of correction are determined for the respective sections 10f1 to 10f8, the corrective patterns are added to or deleted from the design pattern. FIG. 12 illustrates a modified design pattern determined by adding or deleting the corrective patterns, and 10h designates modified shading portions. The modified shading portions 10h are hatched so as to be clearly discriminated.

When the design pattern is corrected, the pattern data codes representative of the modified design pattern are subjected to a format conversion, and a photo-mask is patterned through the electron beam writing followed by the etching.

Figure 13:
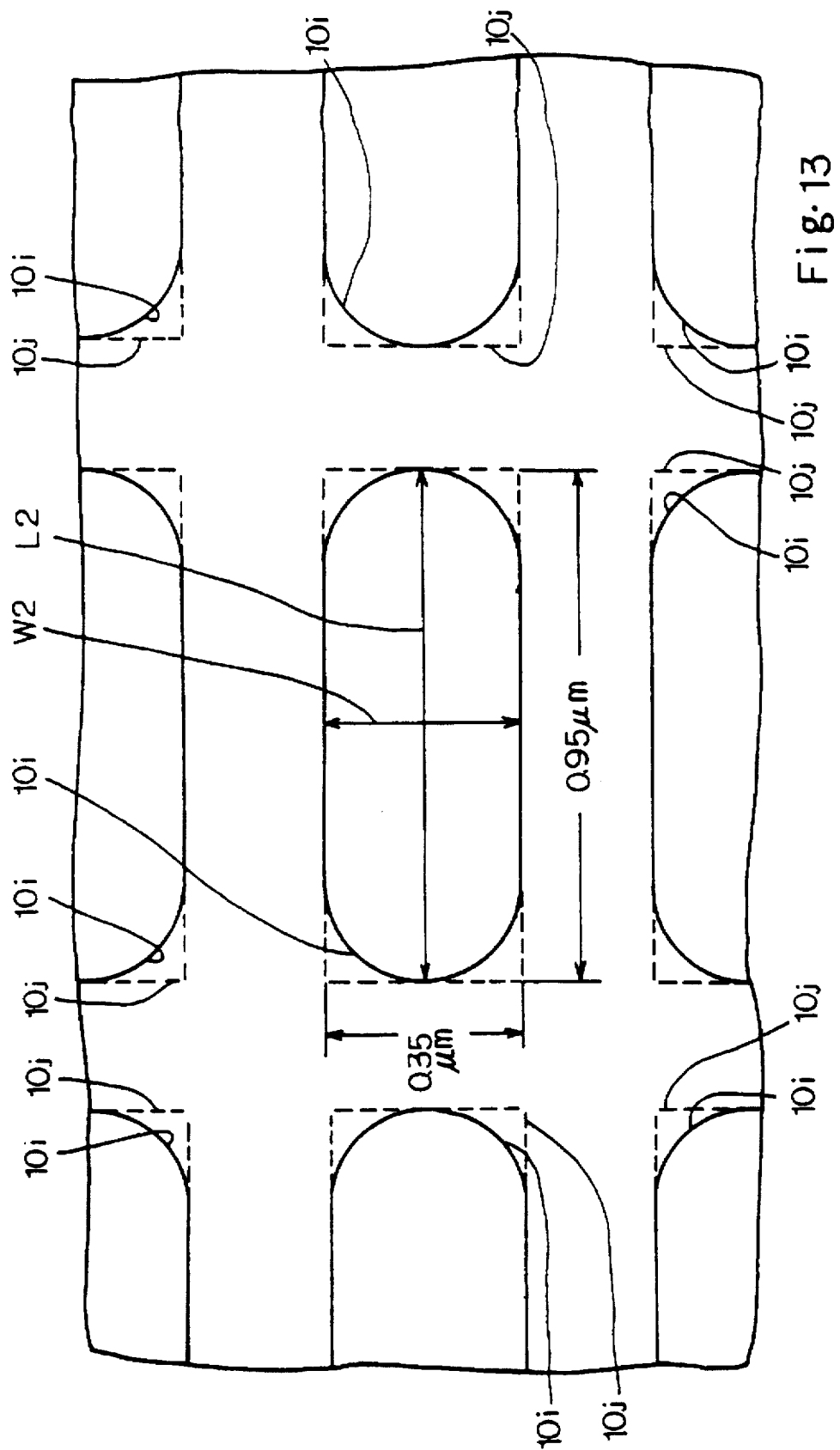
FIG. 13 is a plan view showing an optical image transferred from the modified design pattern through the modified illumination.

FIG. 13 illustrates an optical image transferred from the photo-mask having the modified design pattern to the photo-resist layer through the modified illumination. Although corners are rounded, an image 10i of the modified shading portion 10h on the photo-resist layer is well matched to the side lines of a target image 10j of the shading portion 10b.

Figure 14:
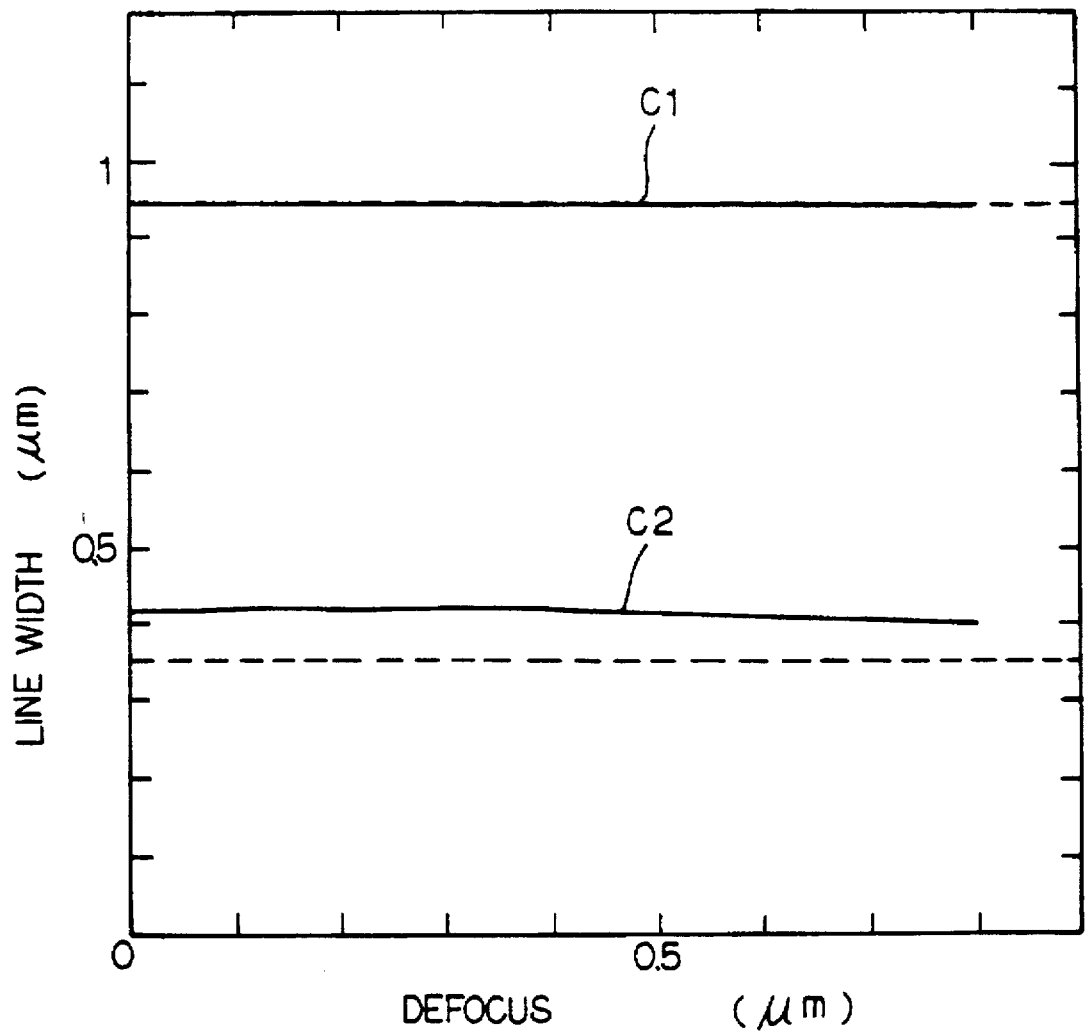
FIG. 14 is a graph showing the characteristics of depth of focus plotted for the prior art.

FIG. 14 illustrates characteristics of depth of focus using a photo-mask produced from the design pattern shown in FIG. 8 at magnification ratio of 5 without the correction according to the present invention. The transferred pattern image is the deformed pattern shown in FIG. 11. Plots C1 are representative of the characteristics of depth of focus in the direction L1, and Plots C2 are representative of the characteristics of depth of focus in the direction W1. The side lines of the optical image 10g are offset from the target side lines wider than the design tolerance of 0.035 micron, and, accordingly, the image does not fall within the depth of focus.

Figure 15:
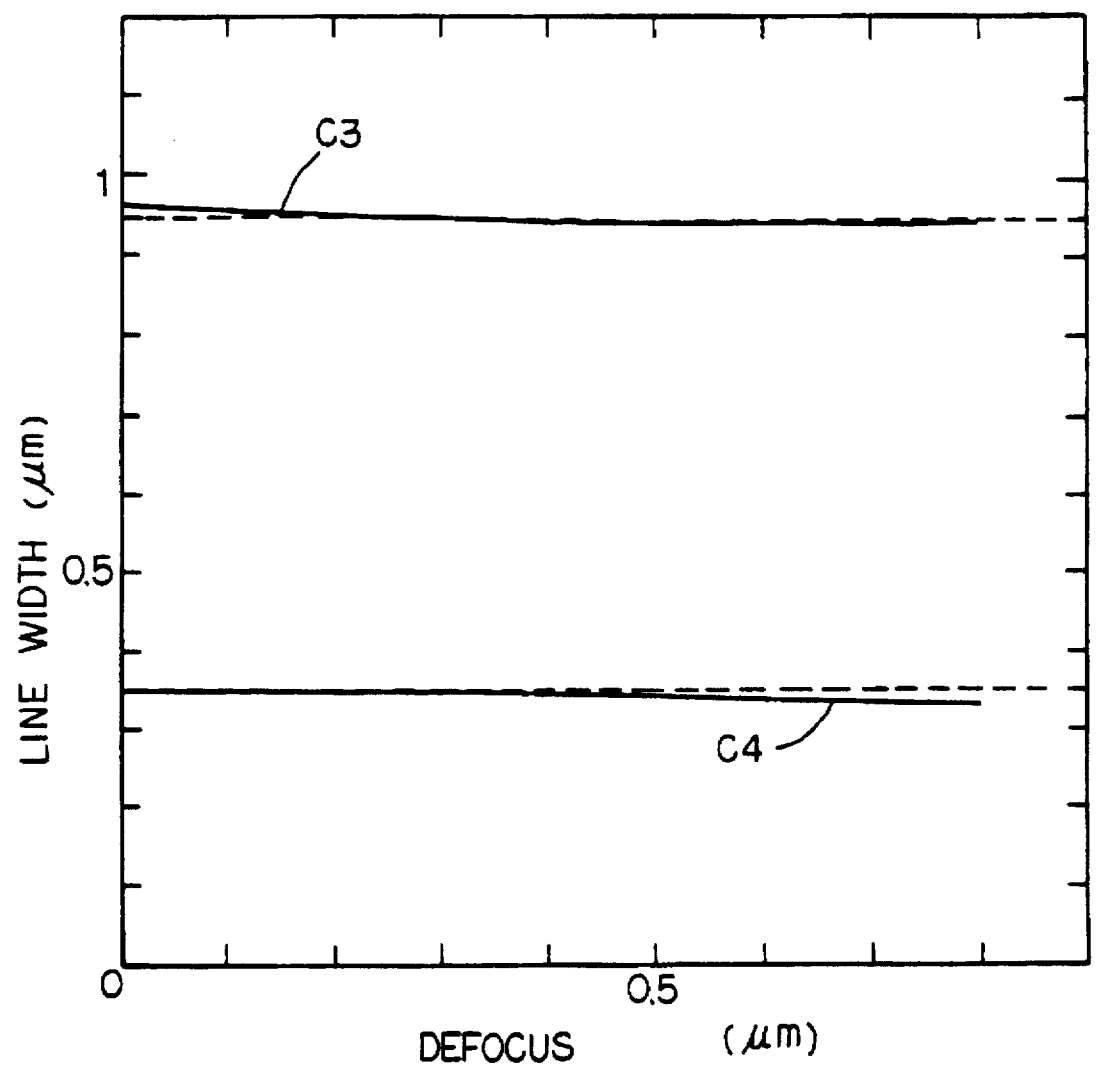
FIG. 15 is a graph showing the characteristics of depth of focus plotted for the optical image transferred from the modified design pattern.

FIG. 15 illustrates characteristics of depth of focus using a photo-mask produced from the modified design pattern shown in FIG. 12. The transferred pattern image is the pattern image shown in FIG. 13. Plots C3 are representative of the characteristics of depth of focus in the direction L2, and Plots C4 are representative of the characteristics of depth of focus in the direction W2. The image falls within the allowable range until the defocus±0.8 micron in the direction of W2, and it is understood that the modified design pattern enhances the depth of focus.

In this instance, the rectangular shading portion 10b shown in FIG. 8 is a target area, the deformed shading portion 10g and the non-deformed shading portion 10b' shown in FIG. 11 are a deformed area image and a non-deformed area image, respectively. The modified shading portion 10h is a modified area, and Equations 5 to 9 are algebraic equations.

As will be appreciated from the foregoing description, the design tool such as a computer-aided-design system determines the modified design pattern through the algebraic equations, and the design work on the photo-mask is drastically decreased in time and labor.

Second Embodiment

Subsequently, description is made of a second embodiment. The second embodiment is only different in calculation for the amount of correction from the first embodiment.

The amount of correction is given by the quadratic equation in the first embodiment. However, if the amount of correction is small, it is possible to ignore "aw$^2$", and the following linear equation is established.

$$bw+c=0 \qquad \text{Equation 10}$$

Therefore, the amount of correction w is given by Equation 11.

$$w=-(c/b) \qquad \text{Equation 11}$$

The present inventor calculated the amount of correction w under the same conditions of the first embodiment. The difference in the amount of correction between the first embodiment and the second embodiment was not greater than 0.01 micron on the photo-mask, and was a fifth, i.e., 0.002 micron on the photo-sensitive layer. The difference on the photo-sensitive layer was much smaller than the tolerance of the line width.

Thus, Equation 11 is usable instead of Equation 5, and the amount of calculation in the second embodiment is decreased in comparison with the first embodiment.

Third Embodiment

Figure 16:
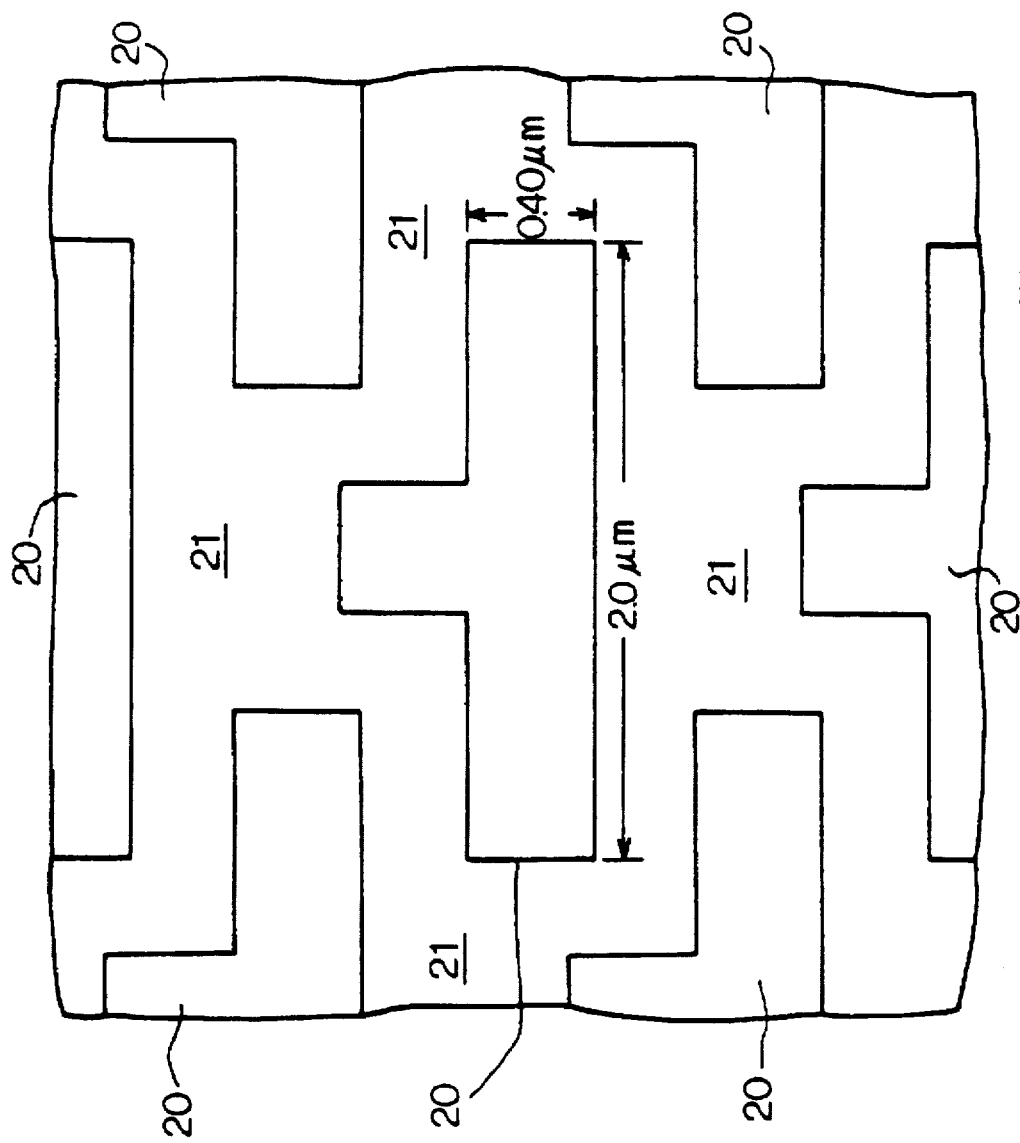
FIG. 16 is a plan view showing a design pattern used in another process of producing a photo-mask according to the present invention.

The third embodiment is described with reference to FIG. 16 showing a periodical design pattern, and a phase shift method is used. Reference numeral 20 designates a target area or apertures to be transferred to a photo-sensitive layer in the design pattern, and a vacant area or a shading area is labeled with reference numeral 21. The process sequence is similar to the first embodiment shown in FIG. 7 except for the step SP3, and description is focused on the calculation of the width w of a corrective pattern.

Figure 17:
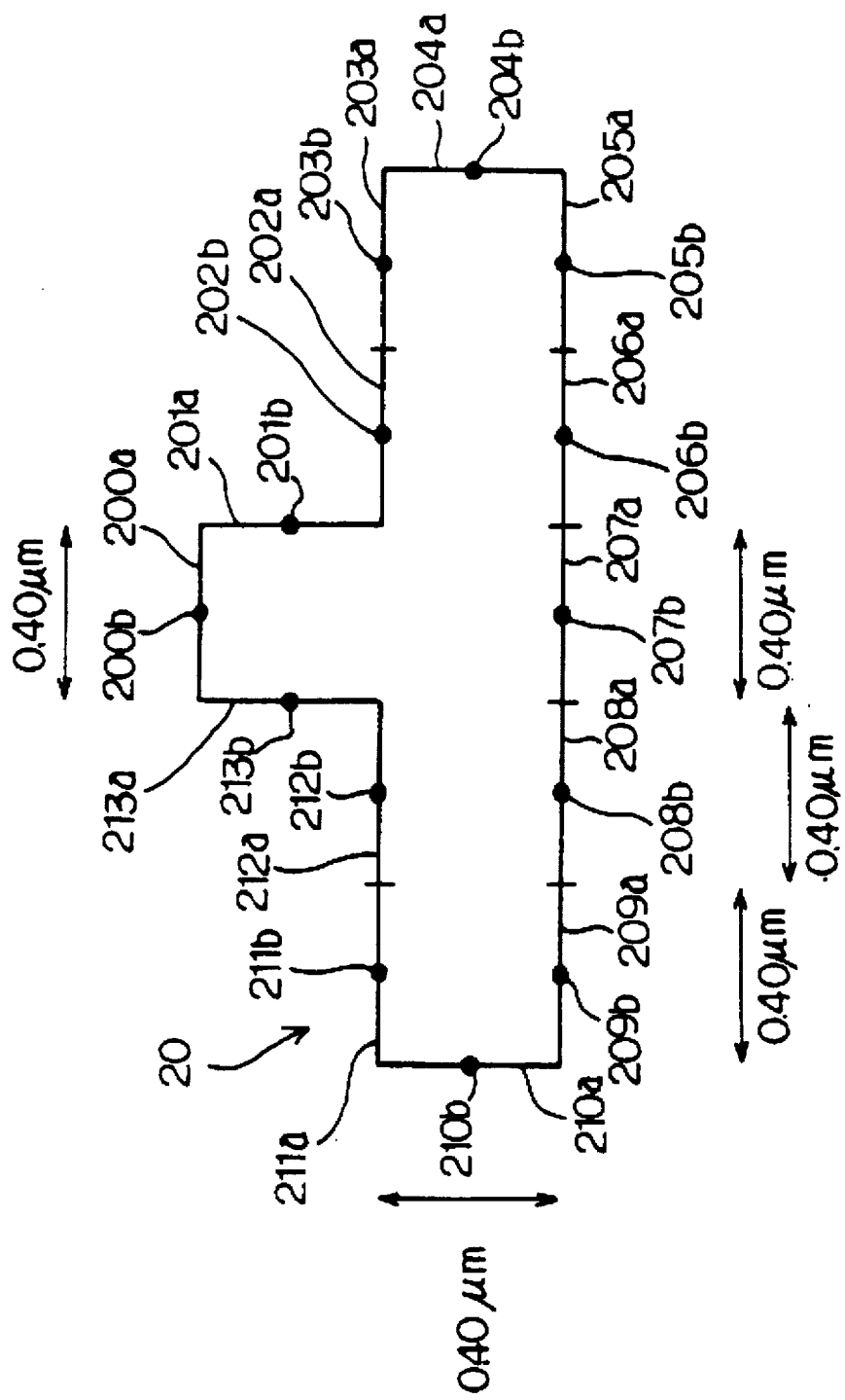
FIG. 17 is a plan view showing a target area of the design pattern.

First, the peripheral line of the target area 20 is divided into a plurality of sections 200a to 213a by 0.4 micron as shown in FIG. 17, and mid points of the sections 200a to 213a are labeled with 200b to 213b, respectively. The mid points 200b to 213b serve as correction points.

Though deviations from the correction points 203b, 204b and 205b can be independently determined by using Equation 5 or 11, mutual influences on optical intensities of adjacent corrective patterns are taken into account in the third embodiemnt.

The corrective patterns for the sections 203a to 205a are, by way of example, close to one another, and the following calculation is appropriate. The coordinates at the corrective points 204b, 203b and 205b are assumed to be P1(u1, v1), P2(u2, v2) and P3(u3, v3). The section 204a is in parallel to y-axis, and the sections 203a and 205a are in parallel to x-axis. Values u1, u2 and u3 are indicative of x-coordinates, and v1, v2 and v3 are indicative of y-coordinates. In order to adjust the optical intensities at P1(u1, v1), P2(u2, v2) and P3(u3, v3) to a reference optical intensity Iopt, corrective patterns are added to or deleted from the sections 204a, 203a and 205a, and are 0.4 micron in length and w1, w2 and w3 in width.

The section 204a is in parallel to y-axis, and the sections 203a and 205a are in parallel to x-axis. Therefore, the corrective patterns delta-t1, delta-t2 and delta-t3 at P1, P2 and P3 are approximated as follows.

$$\text{delta-t1}(x,y; u1,v1) \approx w1\ f(y-u1)\ \delta\ (x-v1) \qquad \text{Equation 12}$$

$$\text{delta-t2}(x,y; u2,v2) \approx w2\ f(x-u2)\ \delta\ (y-v2) \qquad \text{Equation 13}$$

$$\text{delta-t3}(x,y; u3,v3) \approx w3\ f(x-u3)\ \delta\ (y-v3) \qquad \text{Equation 14}$$

f(x) and δ(x) are the same functions as those of the first embodiemnt.

When the corrective patterns delta-t1 to delta-t3 are added to or deleted from the sections 204a, 203a and 205a so as to regulate the optical intensities at P1 to P3 to the reference optical intensity Iopt, Equations 15 to 17 are necessary.

$$Iopt = \iint drds\ S(r,s) |\iint dpdq\{t(p,q) + \text{delta} - \qquad \text{Equation 15}$$
$$t1(p,q;u1,v1) + \text{delta} - t2(p,q;u2,v2) + \text{delta} - t3(p,q;u3,v3)\}$$
$$P(p+r, q+s)e^{2\pi i(pu1+qv1)}|^2$$

$$Iopt = \iint drds\ S(r,s) |\iint dpdq\{t(p,q) + \text{delta} - \qquad \text{Equation 16}$$
$$t1(p,q;u1,v1) + \text{delta} - t2(p,q;u2,v2) + \text{delta} - t3(p,q;u3,v3)\}$$
$$P(p+r, q+s)e^{2\pi i(pu2+qv2)}|^2$$

$$Iopt = \iint drds\ S(r,s) |\iint dpdq\{t(p,q) + \text{delta} - \qquad \text{Equation 17}$$
$$t1(p,q;u1,v1) + \text{delta} - t2(p,q;u2,v2) + \text{delta} - t3(p,q;u3,v3)\}$$
$$P(p+r, q+s)e^{2\pi i(pu3+qv3)}|^2$$

Substitute Equations 12 to 14 for Equations 15 to 17, and the following quadratic equation system is obtained.

$$a1w1^2+b1w1+c1+d12w2w1+d13w3w1+e12w2^2+e13w3^2+f12w2+\\f13w3=0 \qquad \text{Equation 18}$$

$$a2\ w2^2+b2w2+c2+d21w1w2+d23w3w2+e21w1^2+e23w3^2+f21w1+\\f23w3=0 \qquad \text{Equation 19}$$

$$a3w3^2+b3w3+c3+d31w1w3+d32w2w3+e31w1^2+e32w2^2+f31w1+\\f32w2=0 \qquad \text{Equation 20}$$

The coefficients of the quadratic equation system are expressed by Equations 21 to 25.

$$bi=2R\{\iint dr ds S(r,s) \iiiint dpdqdp'dq'i(p,q)\text{delta-}i^*_o(p',q';u_i,v_i)P(p+r,q+s)P^*(p'+r,q'+s)e^{2\pi i[(p-p')u+(q-q')v]}\}$$  Equation 21

$$ci=\iint dr ds S(r,s) \iint dp dq i(p,q) P(p+r,q+s) e^{2\pi i(pu+qv)}|^2 - Iopt$$  Equation 22

$$fij=2R\{\iint dr ds S(r,s) \iiiint dpdqdp'dq'i(p,q) \text{ delta-}i^*_o(p',q';u_j,v_j)P(p+r,q+s)P^*(p'+r,q'+s)e^{2\pi i[(p-p')u+(q-q')v]}\}$$  Equation 23 where i is 1, 2 or 3 and j is 1, 2 or 3.

$$\text{delta-}i_{o1}(p,q;u_1,v_1) = \iint (y-u_1)\delta(x-v_1)e^{-i(pu+qv)} dx dy$$  Equation 24

$$\text{delta-}i_{oi}(p,q;u_i,v_i) = \iint (x-u_i)\delta(y-v_i)e^{-i(pu+qv)} dx dy$$  Equation 25

In equation 25, i is 2 or 3.

Figure 18:
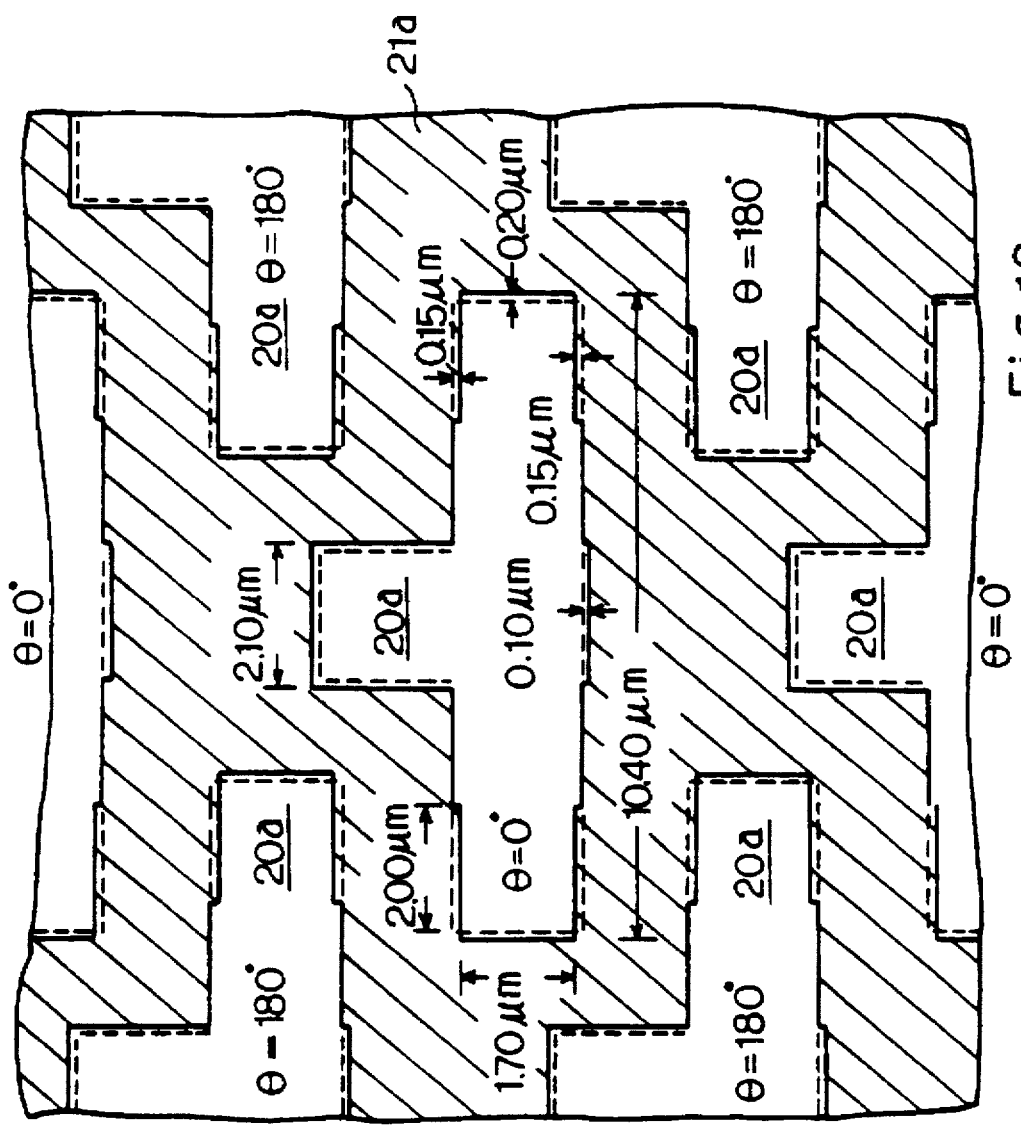
FIG. 18 is a plan view showing a photo-mask where a modified design pattern is realized.

Each of three sets of corrective points 200b/213b/201b, 204b/203b/205b and 210b/209b/211b is assumed to be P1, P2 and P3, and three sets of the corrective patterns are calculated by using Equations 18 to 20. Equation 10 is applied to the other corrective points 202b, 206b, 207b, 208b and 212b, and corrective patterns for the other corrective points 202b, 206b, 207b, 208b and 212b are independently determined. The corrective patterns are added to or deleted from the target areas 20, and the target areas 20 are corrected to modified areas 20a. Thus, a photo-mask is produced as shown in FIG. 18 where the shaded area 21a is hatched. A phase-shift mask (not shown) is used, and a shifter is provided for the modified areas 20a or apertures 20a labeled with "theta=180 degrees". A stepper is equipped with an i-ray radiation source such as a high-pressure mercury lamp, and the i-ray illuminates the phase-shift mask through the conventional illumination system. Numerical aperture is 0.6, and sigma is 0.3.

Figure 19:
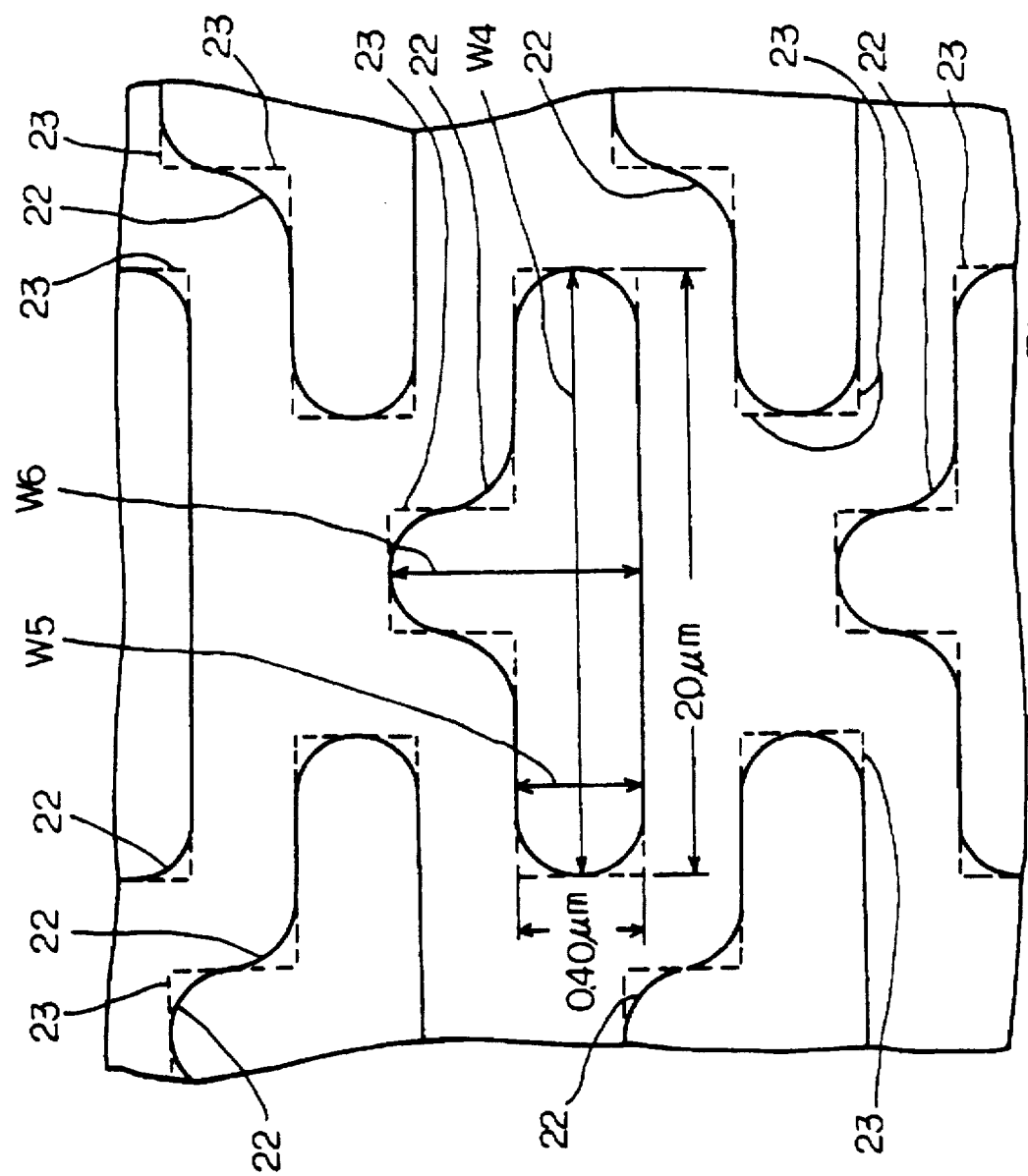
FIG. 19 is a plan view showing an optical image transferred to a photo-resist mask formed through the photo-mask.

When the design pattern in the photo-mask shown in FIG. 18 is transferred to a photo-resist layer (not shown), an optical image shown in FIG. 19 is formed on the photo-resist layer. Broken lines 23 are indicative of a shrunk image of the target area 20. W4, W5 and W6 are widths of the optical image 22.

Figure 20:
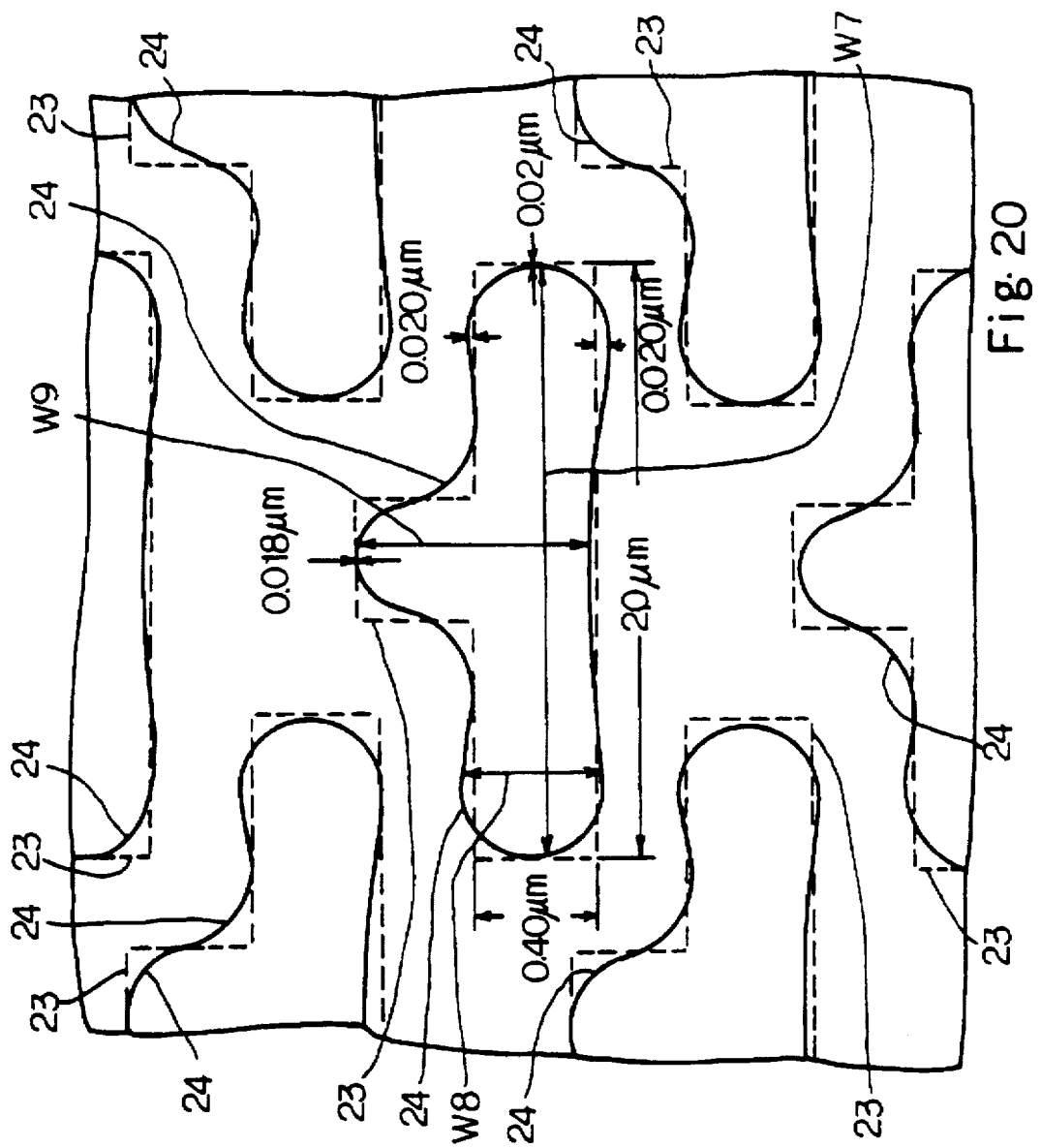
FIG. 20 is a plan view showing an optical image transferred to a photo-resist layer through a photo-mask without the correction.

If the design pattern is realized on a photo-mask at magnification ratio of 5 without the correction, an optical image 24 is formed on a photo-resist layer as shown in FIG. 20. Widths W7, W8 and W9 are corresponding to widths W4, W5 and W6. The corrective patterns calculated by Equations 18 to 20 are effective against the deformation due to the mutual affection.

Figure 21:
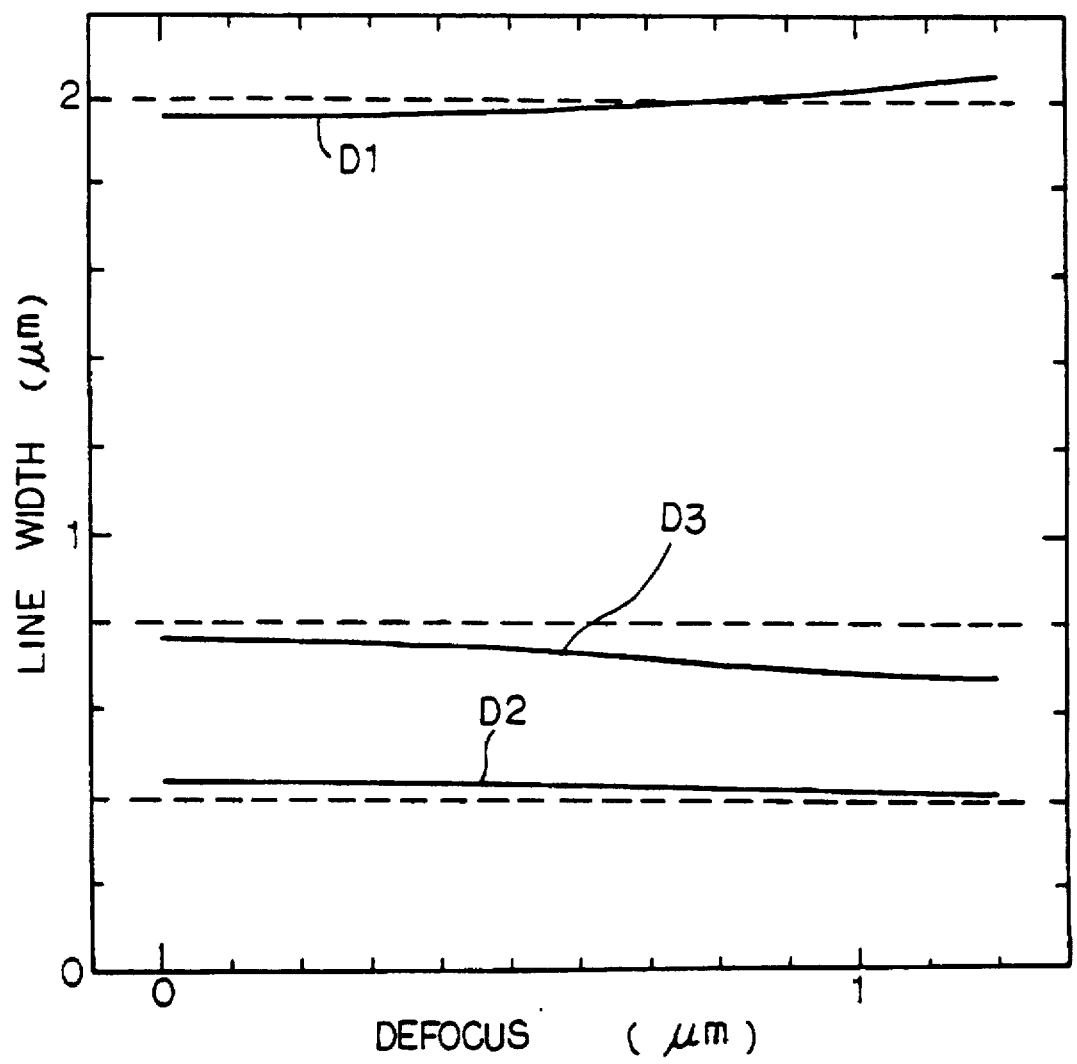
FIG. 21 is a graph showing characteristics of depth of focus measured for the photo-mask without the correction.

FIG. 21 shows characteristics of depth of focus measured for the photo-mask used for the optical image shown in FIG. 20. Plots D1, D2 and D3 are corresponding to width W7, W8 and W9, respectively. When the deviation exceeds the tolerance of ±0.04 micron, the optical image 24 on the photo resist layer is out of the depth of focus.

Figure 22:
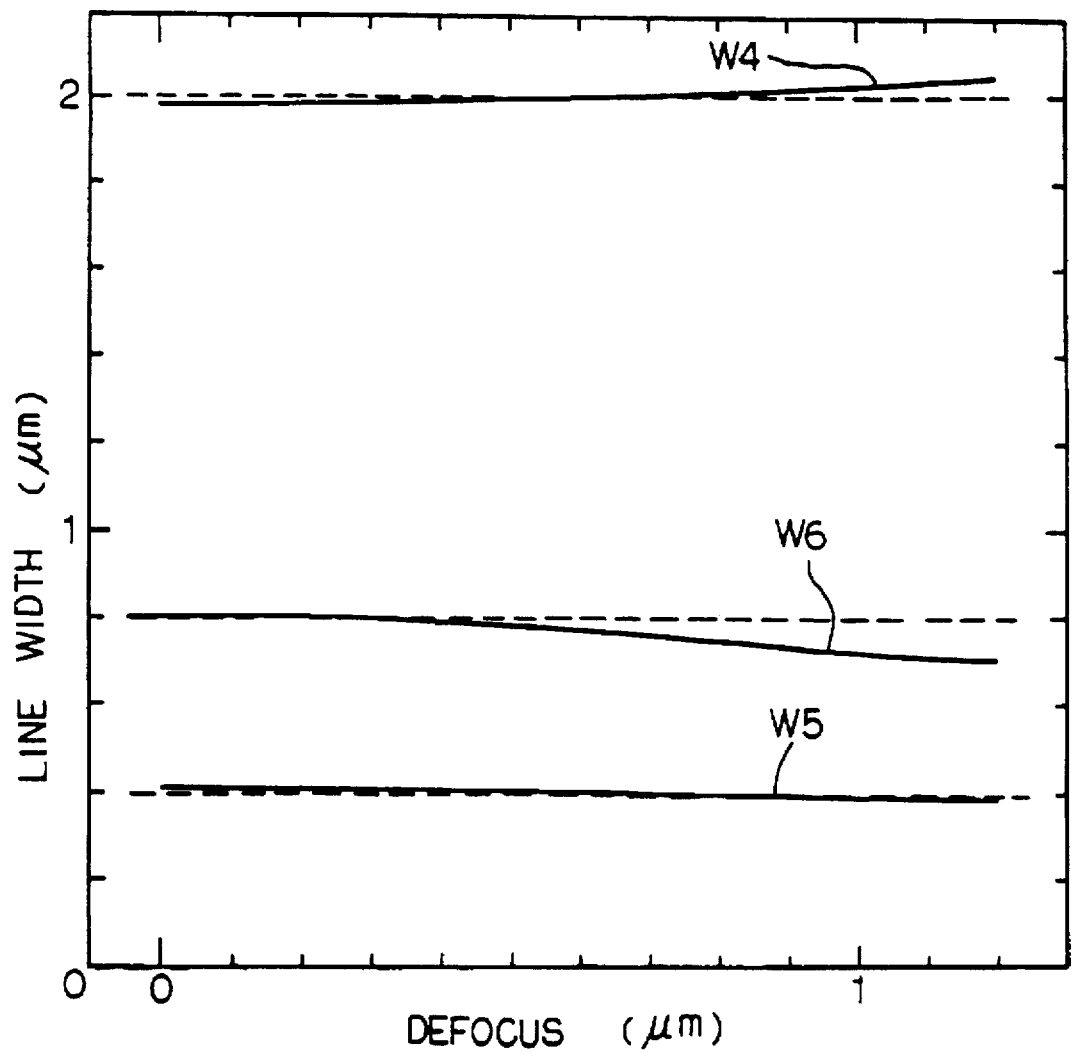
FIG. 22 is a graph showing characteristics of depth of focus measured for the photo-mask shown in FIG. 18.

FIG. 22 shows characteristics of depth of focus for the photo-mask shown in FIG. 18. Plots D4, D5 and D6 are corresponding to widths W4, W5 and W6. The optical image is within the tolerance of deviation until the defocus ±0.8 micron.

Fourth Embodiment

The fourth embodiment is only different in equation system from the third embodiment. Namely, if the amounts of correction W1, w2 and w3 are small, it is possible to ignore all of the members of the second degree. The mutual affection between P2 and P3 is ignoreable, because P2 is far from P3. Then, we obtain a linear equation system i.e., Equations 26 to 28.

$$b1w1+c1+f12w2+f13w3=0$$  Equation 26

$$b2w2+c2+f21w1=0$$  Equation 27

$$b3w3+c3+f31w1=0$$  Equation 28

The amounts w1, w2 and w3 of correction are expressed as follows.

$$w1 = \frac{f12c2b3 + f13c3b2 - c1b2b3}{b1b2b3 - f12f21b3 - f13f31b2}$$  Equation 29

$$w2 = -\frac{c2+f21w1}{b2}$$  Equation 30

$$w3 = -\frac{c3+f31w1}{b3}$$  Equation 31

The present inventors calculated the differences between the amounts w1, w2 and w3 obtained by Equations 18 to 20 and the amount w1, w2 and w3 obtained by Equations 29 to 31 for the three sets of correction points, and conformed that the differences were not greater than 0.002 micron on the photo-resist layer. Thus, Equations 29 to 31 are practical.

In the above described embodiments, a KrF laser source and the i-ray radiation source are used. However, a g-ray or ArF are available for illuminating the photo-mask according to the present invention. The process according to the present invention is effective against the deformation of an optical image formed through not only the modified illumination but also the conventional illumination.

As described in conjunction with the third embodiment, the present invention is applicable to a pattern transfer using a phase shift mask.

The characteristics of depth of focus are further optimized by giving a definite value to the defocus of the pupil function.

As will be appreciated from the foregoing description, the corrective patterns are calculated by using an algebraic function or a set of algebraic functions according to the present invention, and a design work for a photo-mask becomes easy. Moreover, the photo-mask eliminates a deformation of an optical image on a photo-resist layer, and achieves a deep focus depth.

Projection Aligner

Figure 23:
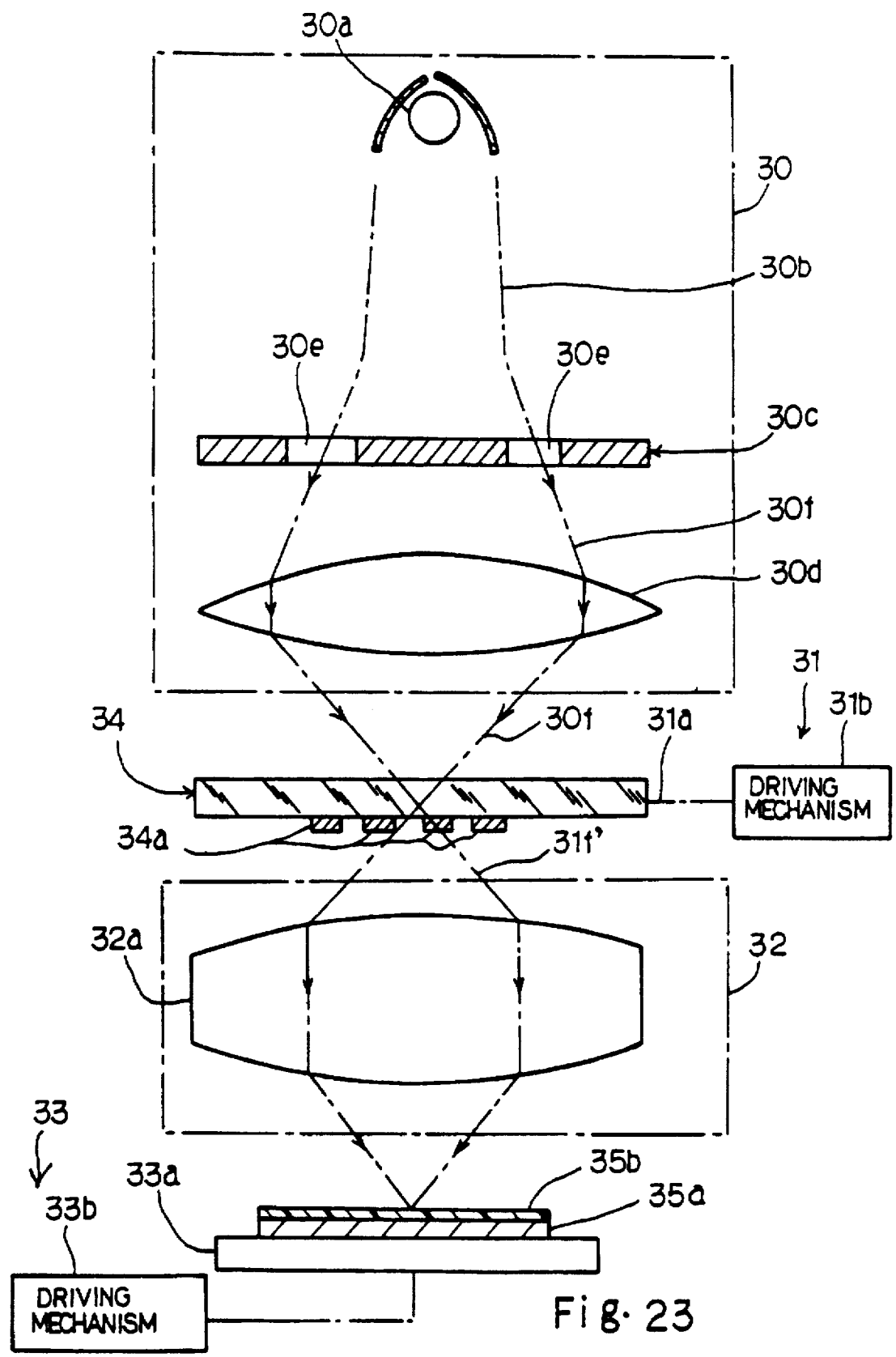
FIG. 23 is a schematic view showing the arrangement of a projection aligner according to the present invention.

Referring to FIG. 23 of the drawings, a projection aligner largely comprises a modified illumination system 30, a mask loading system 31, a projection optical system 32 and a stage system 33, and a photo-mask 34 is provided between the modified illumination system 30 and the projection optical system 32. A semiconductor wafer 35a is covered with a photo-resist layer 35b, and is supported by the stage system 33.

Figure 1:
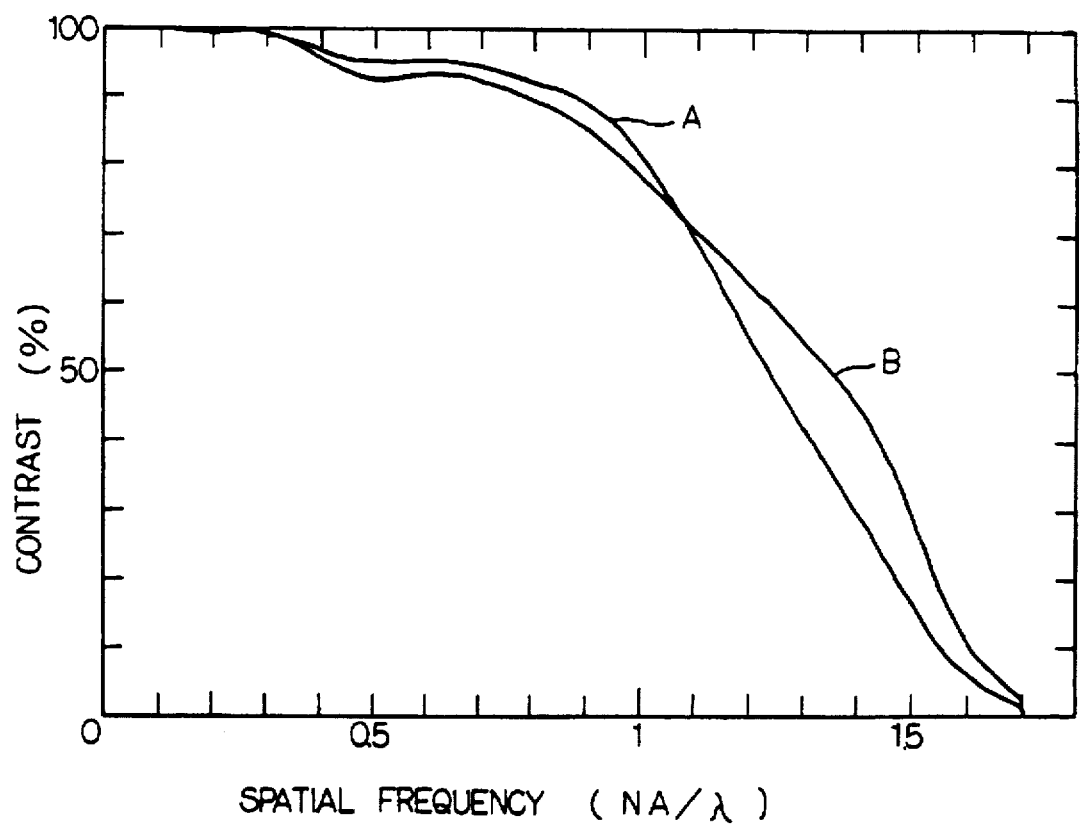
FIG. 1 is a graph showing the spatial frequency response characteristics between the conventional illumination and the modified illumination.
Figure 2:
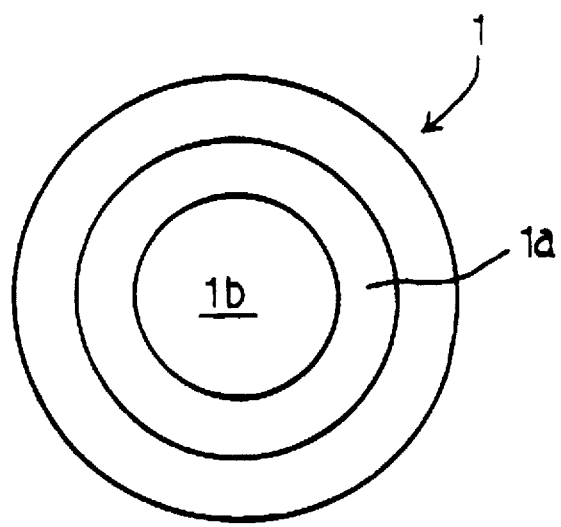
FIG. 2 is a plan view showing the shading plate used in the analysis of the spatial frequency response characteristics.

The modified illumination system 30 includes a light source 30a such as a KrF excimer laser source, and an luminous flux 30b is radiated from the light source 30a toward the photo-mask 34. The illumination flux 30b passes through a shading plate 30c and a lens unit 30d, and an annular aperture 30e is formed in the shading plate 30c as similar to the shading plate I (see FIG. 2). The outer diameter of the annular aperture 30e is equivalent to sigma=0.7, and the inner diameter of the annular aperture 30e is 70 percent of the outer diameter. The shading plate 30c partially shades the luminous flux 30b, and allows a modified luminous flux 30f to be incident into the lens unit 30d. The shading plate 30c makes a central area of the modified luminous flux 30f darker than a central area of the luminous flux 30b. Thus, the shading plate 30c serves as a luminous flux converting means.

The mask loading system 31 includes a mask holder 31a for supporting the photo-mask 34 and a driving mechanism 31b for moving the mask holder 31a and, accordingly, the photo-mask 34 into and out of an optical path of the modified luminous flux 31f. While the modified luminous flux 31f is passing through the photo-mask 34, the modified luminous flux 31f' carries an optical image of a pattern 34a on the photo-mask 34, and transfers the optical image of the pattern 34a to the projection optical system 32.

The projection optical system 32 includes a projection lens unit 32a for demagnifying the optical image of the pattern 34a, and the optical image of the pattern 34a is focused on the photo-sensitive layer 35b. In this instance, the numerical aperture NA of the projection optical system 32 is 5.0, and the demagnification ratio of the projection optical system 32 is ⅕.

The stage system 33 includes a movable stage 33a for mounting the semiconductor wafer 35a and a driving mechanism 33b for two-dimensionally moving the stage 33a. The optical image of the pattern 34a falls onto a selected area of the photo-sensitive layer 35b through the two-dimensional motion of the movable stage 33a.

Figure 24:
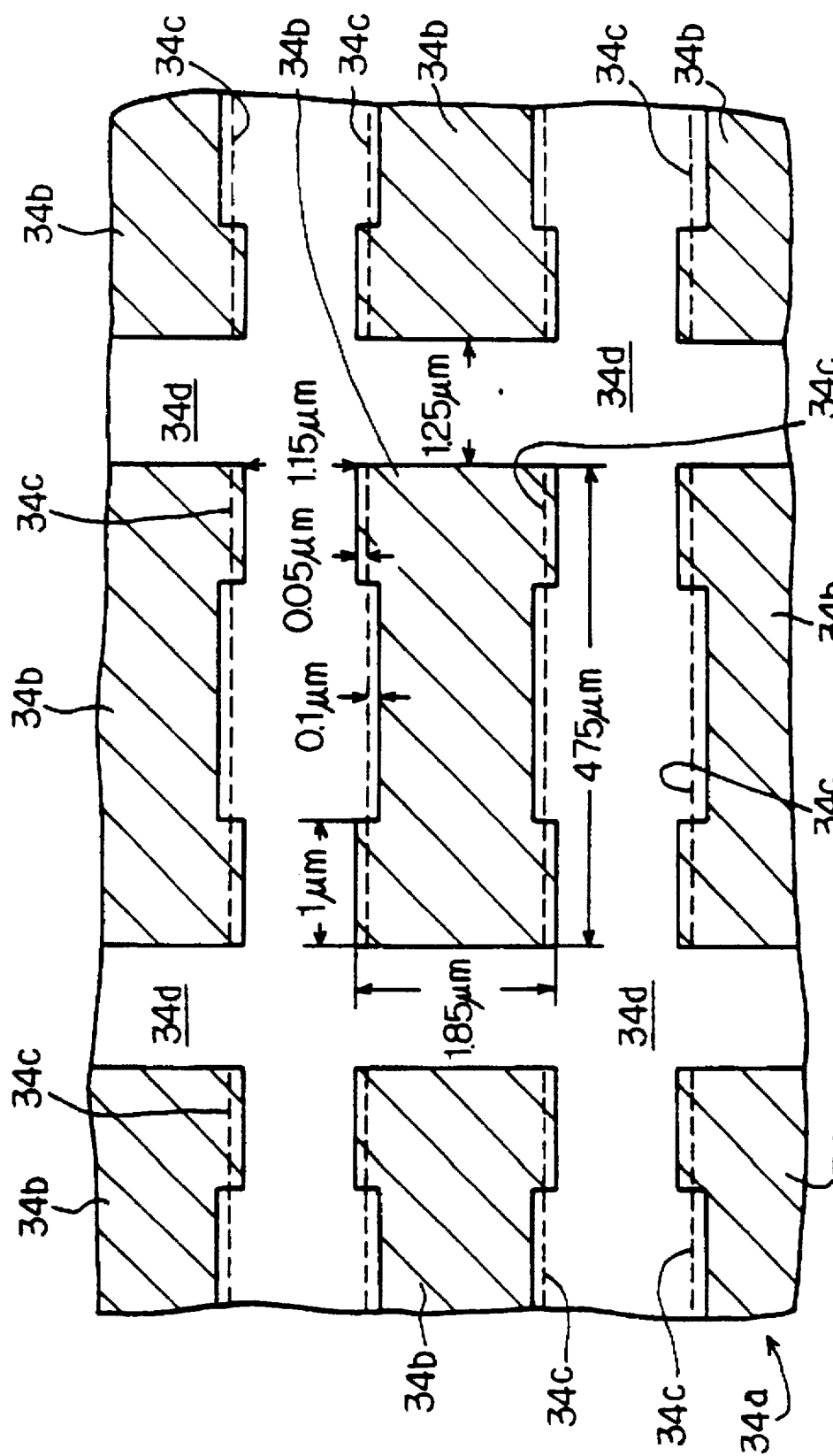
FIG. 24 is a plan view showing a pattern of a photo-mask used in the projection aligner.

FIG. 24 illustrates the modified pattern 34a of the photo-mask 34. The modified pattern 34a is implemented by shading portions 34b arranged in rows and columns on a transparent area 34d, and a design pattern is corrected to the modified pattern 34a. Rectangular shading portions form in combination the design pattern, and broken lines 34c represent an image of the rectangular shading portion.

Figure 3:
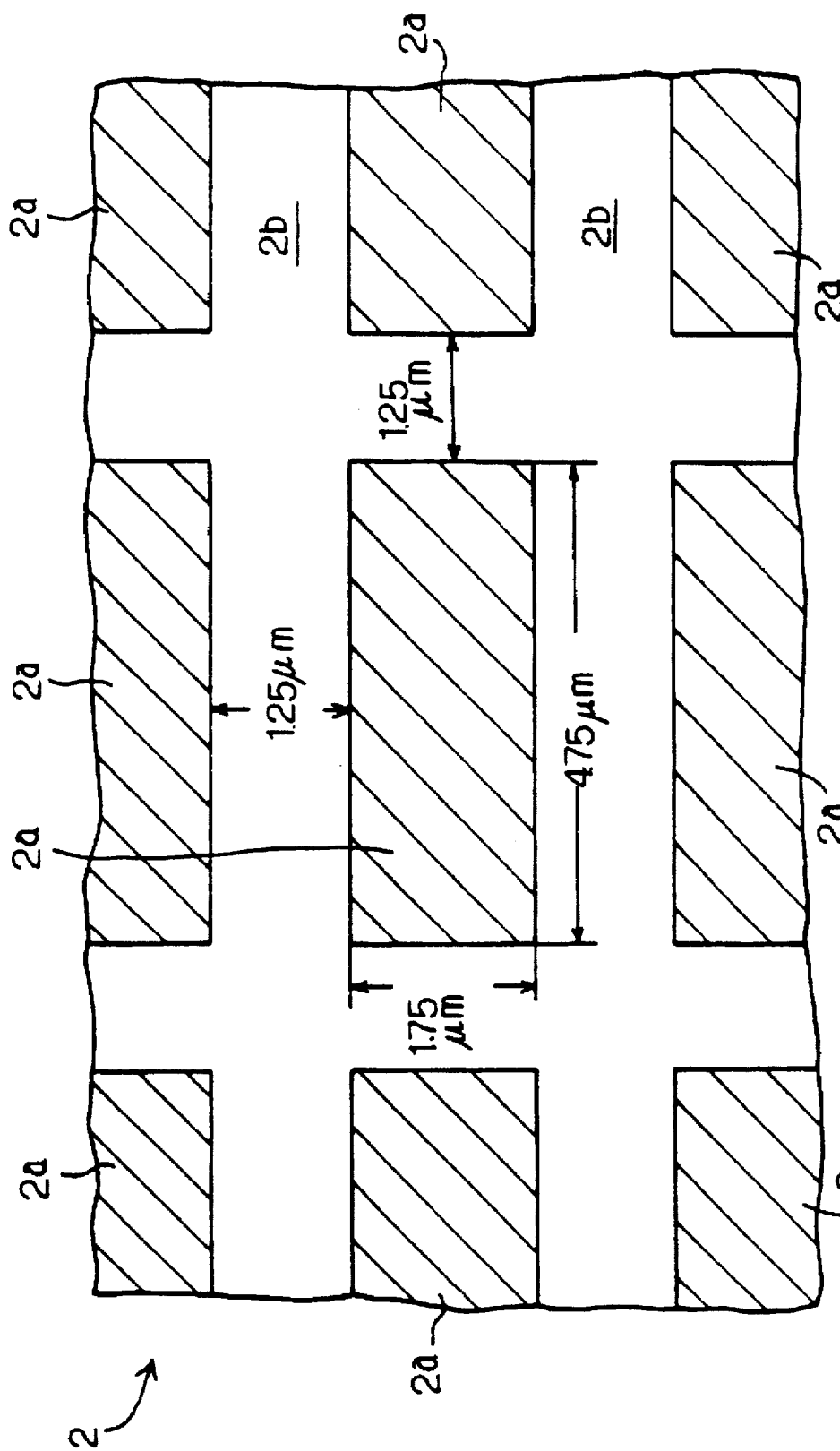
FIG. 3 is a plan view showing the layout of the pattern to be transferred.

As shown in FIG. 3, the shading portion 2a is geometrically similar to the rectangular shading portion. The shading portion 34b is not identical with the rectangular shading portion 34c. The design pattern is corrected to the modified pattern 34a in such a manner as to minimize deviation between an optical image of the modified pattern 34a on the photo-resist layer 35b and a quasi optical image geometrically similar to the design pattern on the photo-resist layer 35b. One of the photo-masks produced through the process according to the present invention may be used as the photo-mask 34.

The modified pattern 34a is transferred to the photo-resist layer 35b as follows. The mask loading system 31 and the stage system 33 move the photo-mask 34 and the photo-resist layer 35b to the respective positions shown in FIG. 23. The KrF excimer laser light is radiated from the light source 30a, and the modified luminous flux 30f is incident into the photo-mask 34.

The modified luminous flux 31f' carries the optical image of the pattern 34a through the projection lens unit 32a, and the projection lens unit 32a focuses the optical image of the pattern 34a on the photo-resist layer 35b.

Figure 25:
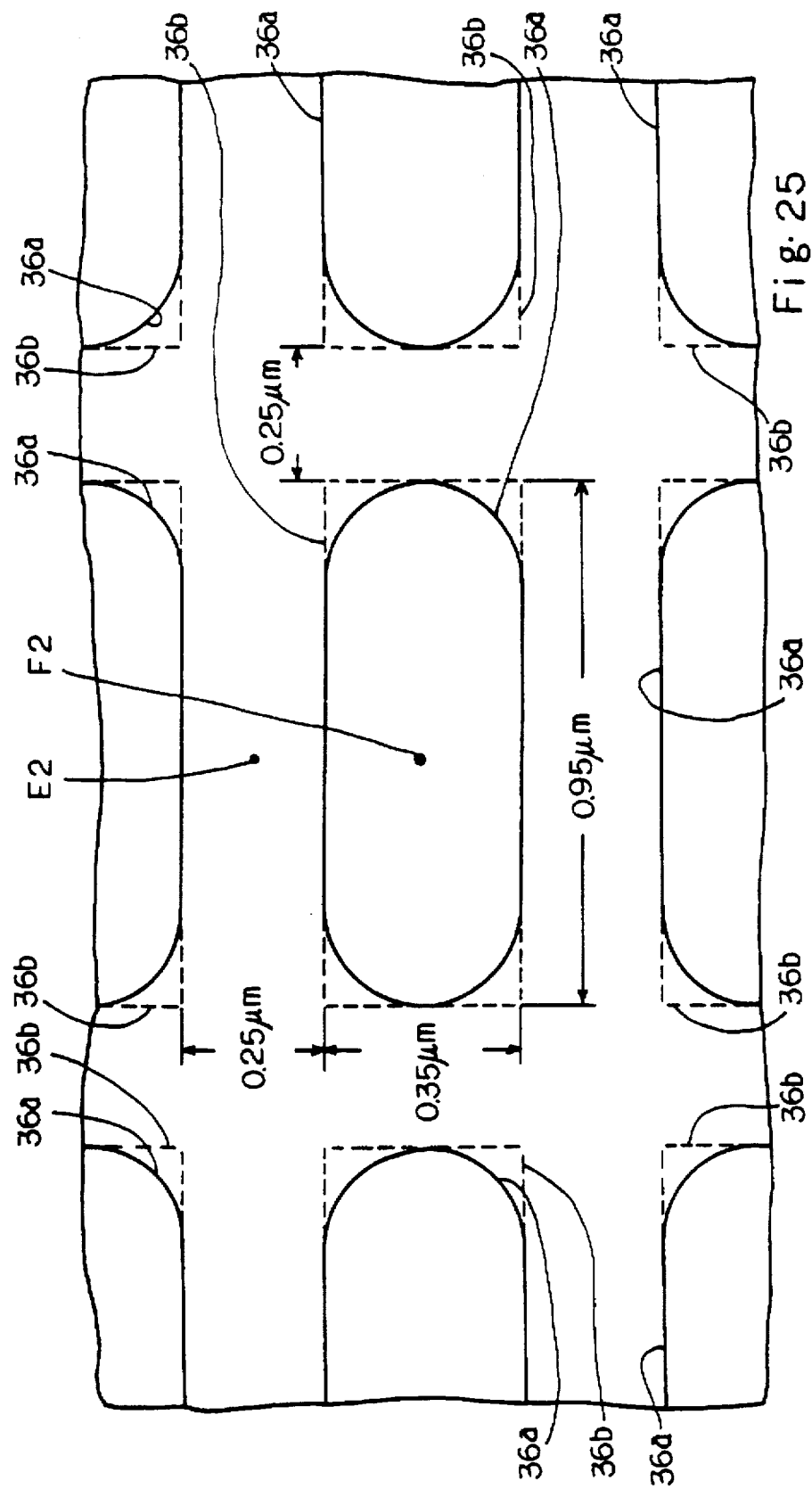
FIG. 25 is a plan view showing an optical image of the pattern fallen onto a photo-resist layer.
Figure 26:
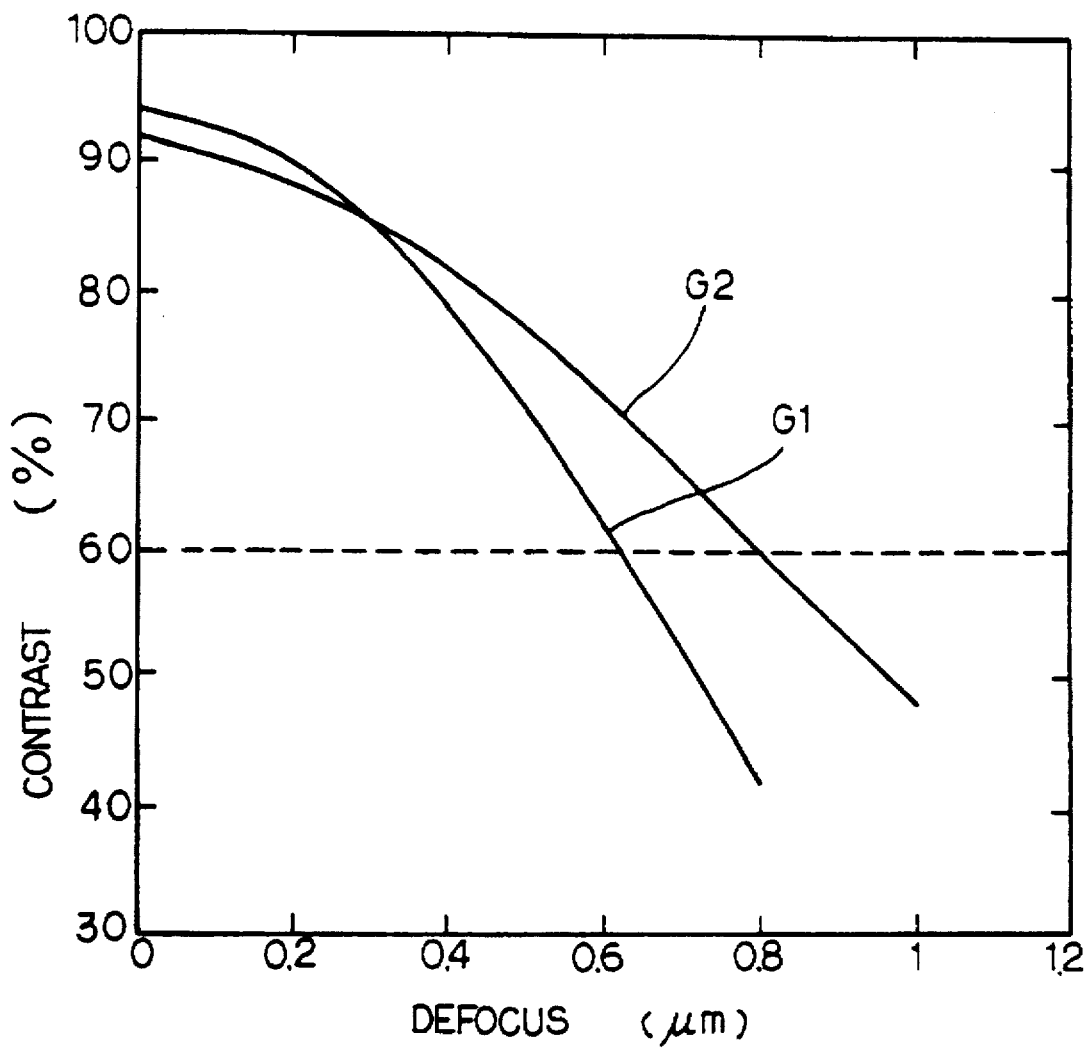
FIG. 26 is a graph showing a contrast in terms of defocus between a conventional illumination and a modified illumination.

The optical image of the pattern 34a is illustrated in FIG. 25, and an optical image of each shading portion 34b is labeled with 36a. A quasi optical image of the design pattern on the photo-resist layer 35b is represented by 36b, and the optical image 36a is approximately equal in width to the quasi optical image 36b. Thus, the optical image 36a is well matched with the quasi optical image 36b.

Figure 4:
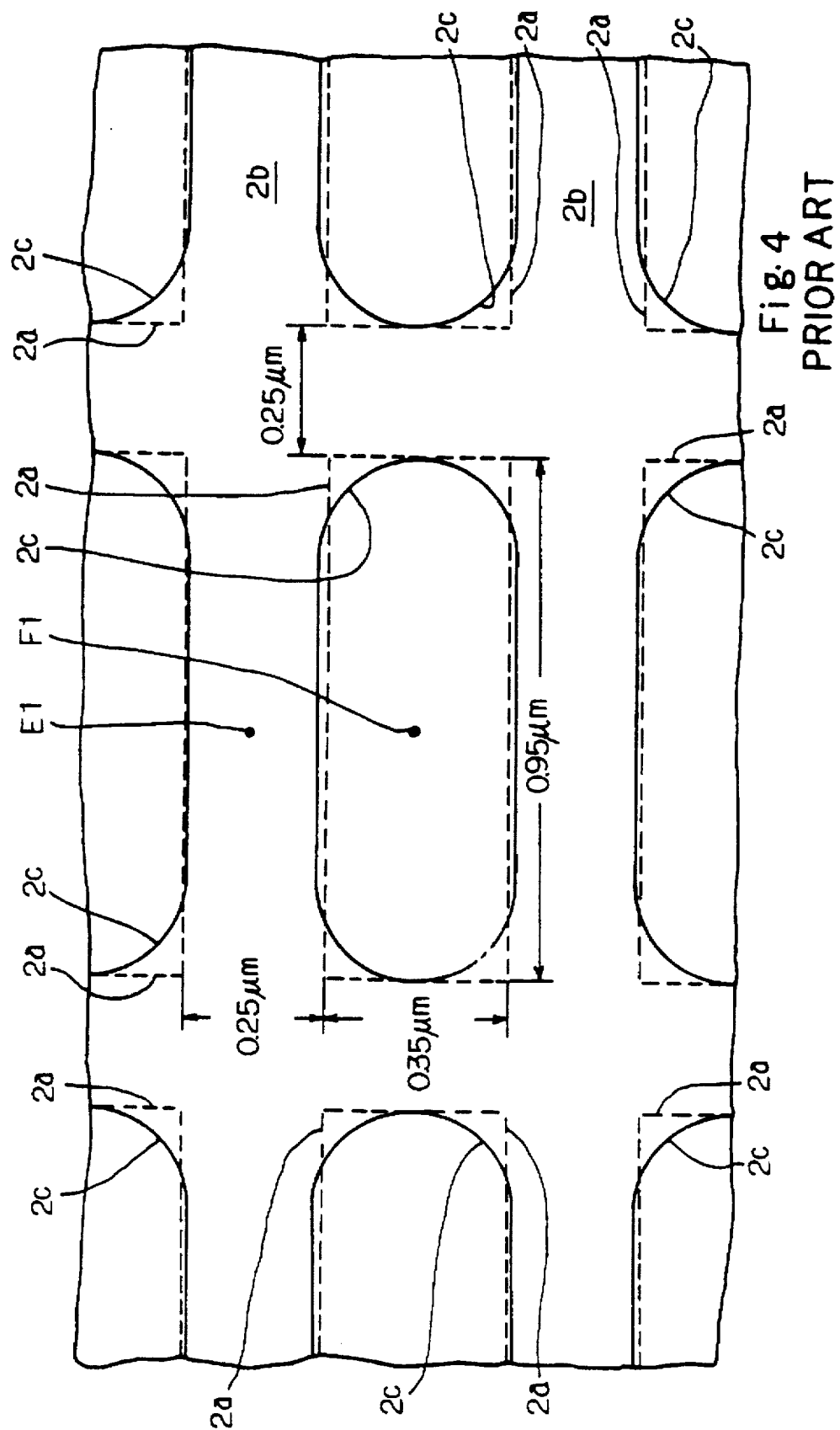
FIG. 4 is a plan view showing the pattern transferred through the conventional illumination.
Figure 5:
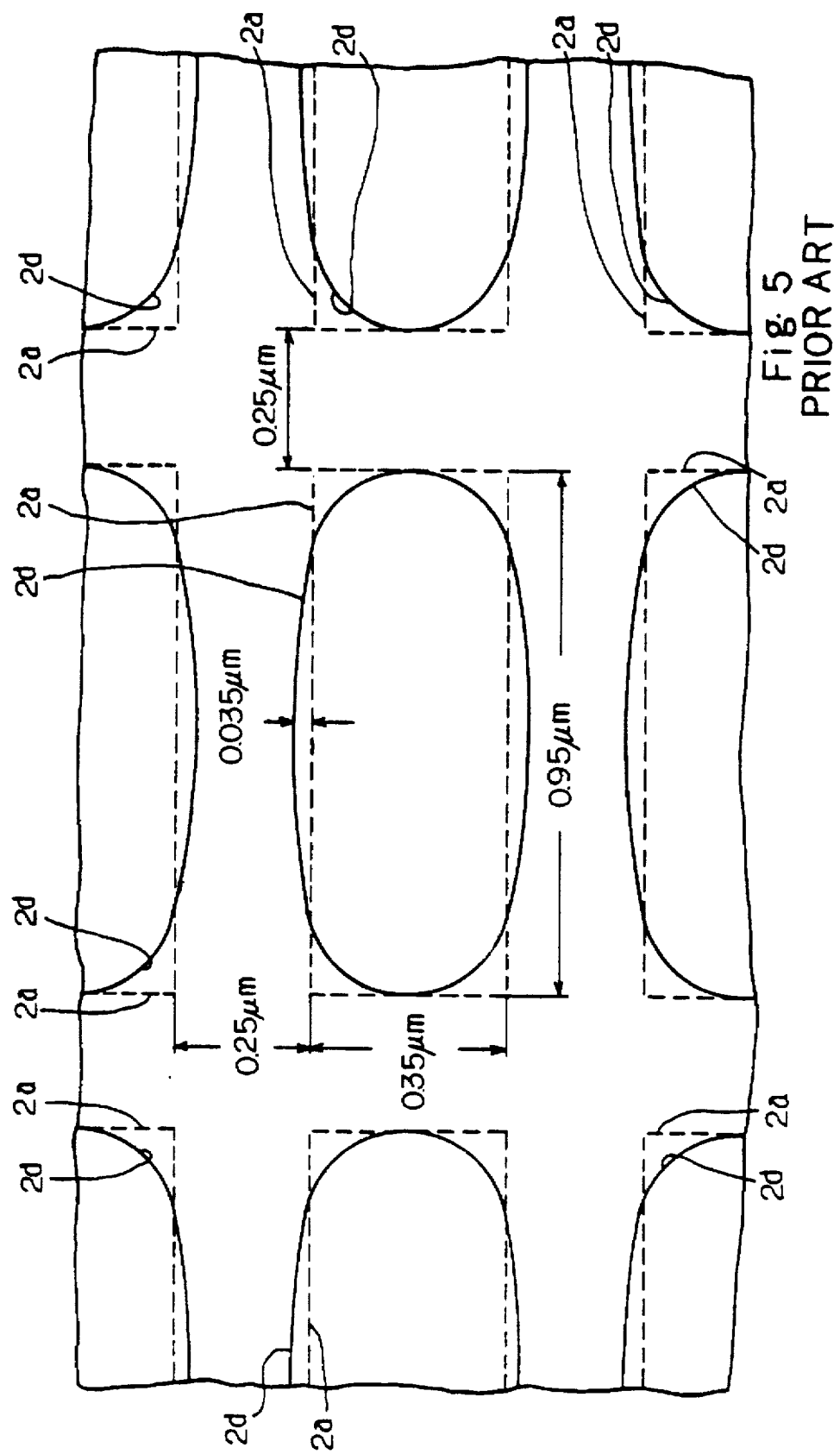
FIG. 5 is a plan view showing the pattern transferred through the modified illumination.
Figure 6:
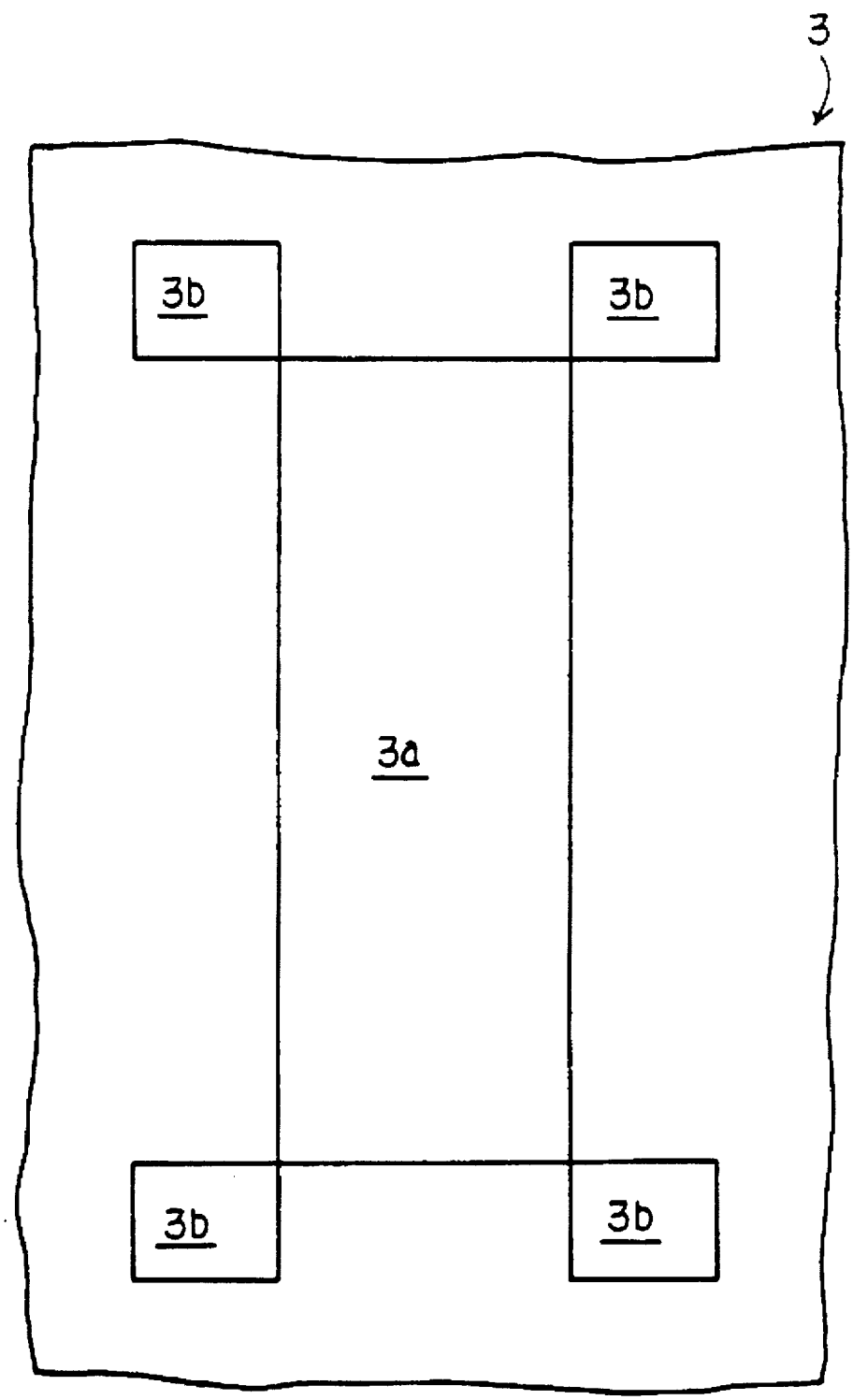
FIG. 6 is a plan view showing the corrective patterns added to the pattern to be transferred.

A conventional illumination system forms an luminous flux substantially uniform in illuminance. When the photo-mask 34 was radiated by the luminous flux substantially uniform in illuminous, the contrast between points E1 and F1 (see FIG. 4) was deteriorated as indicated by Plots G1, here the contrast was calculated on the basis of the optical intensities at points E1 and F1. On the other hand, the contract between points E2 and F2 (see FIG. 25) under the radiation of the modified luminous flux 31f was improved as indicated by Plots G2, and it is understood that the modified illumination is effective against the defocus.

The photo-resist layer 35b requires the contrast equal to or greater than 60 percent. If the conventional illumination is used for the pattern transfer, the depth of focus is only 1.2 microns. On the other hand, the modified illumination achieves the depth of focus at 1.7 microns, and can clearly transfer the miniature pattern to the photo-resist layer 35b.

As described hereinbefore, the numerical aperture NA is 0.5, and the wavelength (lambda) of KrF excimer laser is 0.248 micron. The minimum pattern width of the optical image shown in FIG. 25 is 0.25 micron, and is less than (lambda)/NA=0.496. Thus, if the minimum pattern width is less than (lambda)/NA, the modified luminous flux carrying the modified pattern is clearly focused on the photo-resist layer 35b.

Although particular embodiments of the present invention have been shown and described, it will be obvious to those skilled in the art that various changes and modifications may be made without departing from the spirit and scope of the present invention.

For example, ArF excimer laser or an i-ray is available for the pattern transfer.

Figure 27:
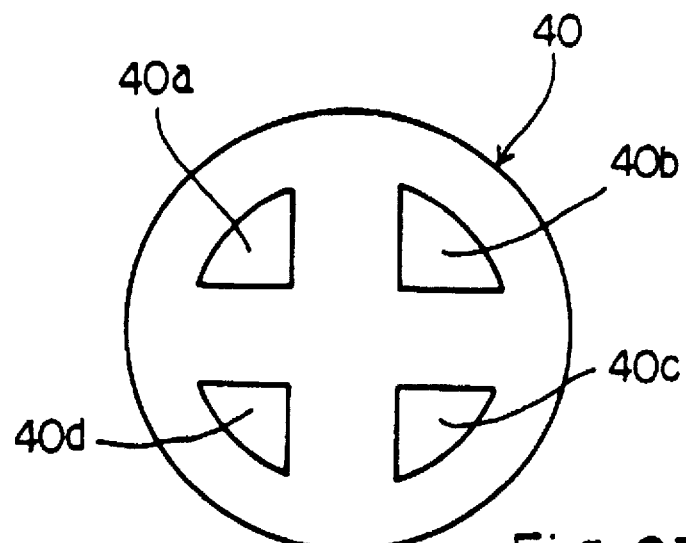
FIG. 27 is a plan view showing a shading plate available for the projection aligner according to the present invention.

The modified illumination is not limited to the annular aperture, and the shading plate 30c may be replaced with a shading plate 40 shown in FIG. 27. The shading plate 40 has four sectorial apertures 40a, 40b, 40c and 40d. Moreover, vibrating reflection mirror/prism and a bundle of optical fibers are available for the modified illumination.

The third and fourth embodiments calculate the widths of the corrective patterns by solving the equation systems. However, the number of corrective values forming the equation system may be arbitrarily selected depending upon influences of the corrective patterns on the optical intensities at the adjacent correction points and the accuracy to be expected.

What is claimed is:

1. A process of fabricating a photo-mask available for a pattern transfer from a photo-mask to a photo-sensitive layer, comprising the steps of:

determining a design pattern having a target area, a first peripheral line of said target area being divided into a plurality of first sections respectively having target points;

determining a first image pattern having a deformed area image transferred from said target area to said photo-sensitive layer through said modified illumination and a second image pattern having a non-deformed area image obtained by transferring said target area onto said photo-sensitive layer without a deformation at a magnification ratio equal to a magnification ratio of said deformed area image, said deformed area image and said non-deformed area image respectively having a second peripheral line and a third peripheral line respectively divided into a plurality of second sections respectively corresponding to said plurality of first sections and a plurality of third sections respectively corresponding to said plurality of second sections, said plurality of second sections respectively having first reference points corresponding to said target points, said plurality of third sections respectively having second reference points corresponding to said first reference points;

determining a modified area having a fourth peripheral line divided into a plurality of fourth sections respectively corresponding to said plurality of first sections, said plurality of fourth sections having respective corrected points corresponding to said target points, distances between said target points and said corrected points being calculated through algebraic equations in such a manner that said plurality of fourth sections minimize differences in optical intensity between said first reference points and the corresponding second reference points;

replacing said target area with said modified area; and forming a photo-mask having a modified pattern with said modified area.

2. The process as set forth in claim 1, in which a difference w between each of said target points and each of said corrected points is given as $$w = (-b + \sqrt{b^2 - 4ac}\,)/2a$$

where a, b and c are expressed as $a = \iint dr ds S(r,s) |\iint dp dq \text{ delta-}i0(p,q;u,v) P(p+r,q+s) e^{2\pi i(pu+qv)}|^2$ $b = 2R\{\iint dr ds S(r,s) \iiiint dp dq dp' dq' \hat{t}(p,q) \text{delta-}i^*0(p',q';u,v) P(p+r,q+s) P^*(p'+r,q'+s) e^{2\pi i(p-p')u+(q-q')v]}\}$ $c = \iint dr ds S(r,s) |\iint dp dq \hat{t}(p,q) P(p+r,q+s) e^{2\pi i(pu+qv)}|^2 - I_{opt}$ where (u,v) is a coordinate data of said target point, Iopt is a reference optical intensity, P(p,q) is a pupil function, S(r,s) is an effective light source, t(x,y) is a amplitude transmittance, delta is a Dirac's delta function and delta-t0 (p,q;u,v) is $\iint f(x-u)\delta(y-v)e^{-i(px+qy)}dxdy$.

3. The process as set forth in claim 1, in which a difference w between each of said target points and each of said corrected points is given as $$w = -(c/b)$$

where b and c are expressed as $b = 2R\{\iint dr ds S(r,s) \iiiint dp dq dp' dq' \hat{t}(p,q) \text{delta-}i^*0(p',q';u,v) P(p+r,q+s) P^*(p'+r,q'+s) e^{2\pi i(p-p')u+(q-q')v]}\}$ $c = \iint dr ds S(r,s) |\iint dp dq \hat{t}(p,q) P(p+r,q+s) e^{2\pi i(pu+qv)}|^2 - I_{opt}$ where (u,v) is a coordinate data of said target point, Iopt is a reference optical intensity, P(p,q) is a pupil function, S(r,s) is an effective light source, t(x,y) is a amplitude transmittance, delta is a Dirac's delta function and delta-t0 (p,q;u,v) is $\iint f(x-u) \delta (y-v)e^{-i(px+qy)}dxdy$.

4. The process as set forth in claim 1, in which target points selected from said plurality of target points form a plurality of sets of target points, each set of target points being optically affected by one another in a pattern transfer, a set of differences w1, w2 and w3 between said target points of each set and said corrected points being given by solving the following equation system $a1w1^2 + b1w1 + c1 + d12w2w1 + d13w3w1 + e12w2^2 + e13w3^2 + f12w2 + f13w3 = 0$ $a2\,w2^2 + b2w2 + c2 + d21w1w2 + d23w3w2 + e21w1^2 + e23w3^2 + f21w1 + f23w3 = 0$ $a3w3^2 + b3w3 + c3 + d31w1w3 + d32w2w3 + e31w1^2 + e32w2^2 + f31w1 + f32w2 = 0$ where a1, b1, c1 a2, b2, c2, a3, b3, c3, d12, d13, d21, d23, d31, d32, e12, e13, e21, e23, e31, e32, f12, f13, f21, f23, f31 and f32 are coefficients.

5. The process as set forth in claim I, in which target points selected from said plurality of target points form a plurality of sets of target points, one of said target points of each optically affecting the others of said target points of the same set in a pattern transfer, a set of differences w1, w2 and w3 between said target points of each set and said corrected points being given by solving the following equation system $$w1 = -\frac{f12c2b3 + f13c3b2 - c1b2b3}{b1b2b3 - f12f21b3 - f13f31b2}$$

$$w2 = -\frac{c2 + f21w1}{b2}$$

$$w3 = -\frac{c3 + f31w1}{b3}$$

where f12, f13, f21, f31, b1, b2, b3, c1 c2 and c3 are coefficient.

6. The process as set forth in claim 1, in which said target area has corners, and first sections selected from said plurality of first sections are measured from said corners by a constant value.

7. The process as set forth in claim 1, in which said pattern transfer is carried out under a modified illumination.

8. A projection aligner for transferring a modified pattern produced from a design pattern and formed on a photo-mask to a photo-sensitive layer, comprising:

an illumination system including a light source for radiating a luminous flux and a luminous flux converting means for converting said luminous flux to a modified luminous flux, said modified luminous flux having a central area darker than a central area of said luminous flux;

a projection optical system for projecting said modified luminous flux to said photo-sensitive layer; and a mask holding system holding said photo-mask between said luminous system and said projection optical system so that said modified luminous flux carries said modified pattern onto said photo-sensitive layer, said design pattern being corrected to said modified pattern in such a manner as to minimize a difference in optical intensity between an optical image on said photo-sensitive layer and a quasi optical image geometrically similar to said design pattern on said photo-sensitive layer by using algebraic equations.

9. The projection aligner as set forth in claim 8, in which a minimum pattern width of said optical image on said photo-sensitive layer is expressed as MIN<(lambda)/NA where MIN is said minimum pattern width, lambda is a wavelength of said modified luminous flux and NA is a numerical aperture of said projection optical system.

10. A method of transferring a modified pattern to a photo-sensitive layer, comprising the steps of:

preparing a projection aligner including a modified illumination system with a light source for radiating an luminous flux, a projection optical system and a stage, a photo-sensitive layer and a photo-mask having a modified pattern, said illuminous flux having a central area darker than a peripheral area of said luminous flux, a design pattern being corrected to said modified pattern in such a manner as to minimize a difference in optical intensity between an optical image on said photo-sensitive layer and a quasi optical image geometrically similar to said design pattern on said photo-sensitive layer by using algebraic equations;

placing said photo-mask and said photo-sensitive layer between said modified illumination system and said projection optical system and after said projection optical system, respectively; and radiating said luminous flux from said modified illumination system through said photo-mask and said projection optical system to said photo-sensitive layer so as to form said optical image of said modified pattern on said photo-sensitive layer.

11. The method as set forth in claim 10, in which a minimum pattern width of said optical image on said photo-sensitive layer is expressed as MIN<(lambda)/NA where MIN is said minimum pattern width, lambda is a wavelegth of said modified illuminous flux and NA is a numerial aperture of said projection optical system.

* * * * *

UNITED STATES PATENT AND TRADEMARK OFFICE
CERTIFICATE OF CORRECTION

PATENT NO.   : 5,631,110
DATED        : May 20, 1997
INVENTOR(S)  : Shiori SATOMI It is certified that error appears in the above-indentified patent and that said Letters Patent is hereby corrected as shown below:

On title page, item [30]

In the Priority Data, delete "5-153189" and insert --6-153189--.

Signed and Sealed this

Ninth Day of September, 1997

*Attest:*

BRUCE LEHMAN

*Attesting Officer*     *Commissioner of Patents and Trademarks*